United States Patent
Komiya et al.

(10) Patent No.: US 11,251,193 B2
(45) Date of Patent: Feb. 15, 2022

(54) SEMICONDUCTOR MEMORY DEVICE

(71) Applicant: Toshiba Memory Corporation, Tokyo (JP)

(72) Inventors: Ken Komiya, Nagoya Aichi (JP); Takashi Ishida, Yokkaichi Mie (JP); Hiroshi Kanno, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 211 days.

(21) Appl. No.: 16/558,725

(22) Filed: Sep. 3, 2019

(65) Prior Publication Data

US 2020/0279864 A1   Sep. 3, 2020

(30) Foreign Application Priority Data

Feb. 28, 2019 (JP) .............................. JP2019-036825

(51) Int. Cl.
*H01L 27/11582* (2017.01)
*H01L 27/11524* (2017.01)
*H01L 27/11556* (2017.01)
*H01L 21/74* (2006.01)
*H01L 29/10* (2006.01)
*H01L 27/1157* (2017.01)

(52) U.S. Cl.
CPC ...... *H01L 27/11582* (2013.01); *H01L 21/743* (2013.01); *H01L 27/1157* (2013.01); *H01L 27/11524* (2013.01); *H01L 27/11556* (2013.01); *H01L 29/1083* (2013.01); *H01L 29/1087* (2013.01)

(58) Field of Classification Search
CPC ......... H01L 27/11582; H01L 27/11524; H01L 27/11556; H01L 27/1157; H01L 29/1087
See application file for complete search history.

(56) References Cited

U.S. PATENT DOCUMENTS

| | | | |
|---|---|---|---|
| 8,194,453 B2 | 6/2012 | Maejima | |
| 9,324,727 B2* | 4/2016 | Lee | .................. H01L 27/11551 |
| 9,508,737 B2* | 11/2016 | Kim | .................. H01L 27/11582 |

(Continued)

FOREIGN PATENT DOCUMENTS

JP    2017-174866 A    9/2017

*Primary Examiner* — Mark W Tornow
*Assistant Examiner* — Abbigale A Boyle
(74) *Attorney, Agent, or Firm* — Kim & Stewart LLP

(57) ABSTRACT

A semiconductor memory device includes a substrate, gate electrodes arranged in a thickness direction of the substrate, first and second semiconductor layers, a gate insulating film, and a first contact. The first semiconductor layer extends in the thickness direction and faces the gate electrodes. The gate insulating film is between the gate electrodes and the first semiconductor layer. The second semiconductor layer is between the substrate and the gate electrodes and connected to a side surface of the first semiconductor layer in a surface direction. The first contact extends in the thickness direction and electrically connected to the second semiconductor layer. The second semiconductor layer includes a first region in contact with the side surface of the first semiconductor layer and containing P-type impurities, and a first contact region electrically connected to the first contact and having a higher concentration of N-type impurities than the first region.

20 Claims, 42 Drawing Sheets

(56) References Cited

U.S. PATENT DOCUMENTS

| | | | |
|---|---|---|---|
| 9,530,789 B2* | 12/2016 | Lee | H01L 27/1157 |
| 9,553,105 B2* | 1/2017 | Lee | H01L 29/40117 |
| 9,601,577 B1* | 3/2017 | Lee | H01L 21/823462 |
| 9,793,139 B2 | 10/2017 | Sharangpani et al. | |
| 9,824,966 B1* | 11/2017 | Kanakamedala | H01L 27/11582 |
| 10,068,917 B2* | 9/2018 | Kanamori | H01L 29/42344 |
| 10,418,372 B2* | 9/2019 | Choi | H01L 27/11541 |
| 2011/0284946 A1 | 11/2011 | Kiyotoshi | |
| 2017/0077121 A1* | 3/2017 | Sato | H01L 21/2256 |
| 2017/0271349 A1 | 9/2017 | Miyagawa et al. | |
| 2018/0040565 A1* | 2/2018 | Watarai | H01L 23/53295 |
| 2018/0366488 A1* | 12/2018 | Choi | H01L 29/42328 |

* cited by examiner

SEMICONDUCTOR MEMORY DEVICE

CROSS-REFERENCE TO RELATED APPLICATION

This application is based upon and claims the benefit of priority from Japanese Patent Application No. 2019-036825, filed Feb. 28, 2019, the entire contents of which are incorporated herein by reference.

FIELD

Embodiments described herein relate generally to a semiconductor memory device.

BACKGROUND

A semiconductor memory device includes a substrate, a plurality of gate electrodes arranged along a first direction intersecting a surface of the substrate, a semiconductor layer extending in the first direction and facing the plurality of gate electrodes, and a gate insulating film provided between the gate electrodes and the semiconductor layer.

DETAILED DESCRIPTION

Figure 1:
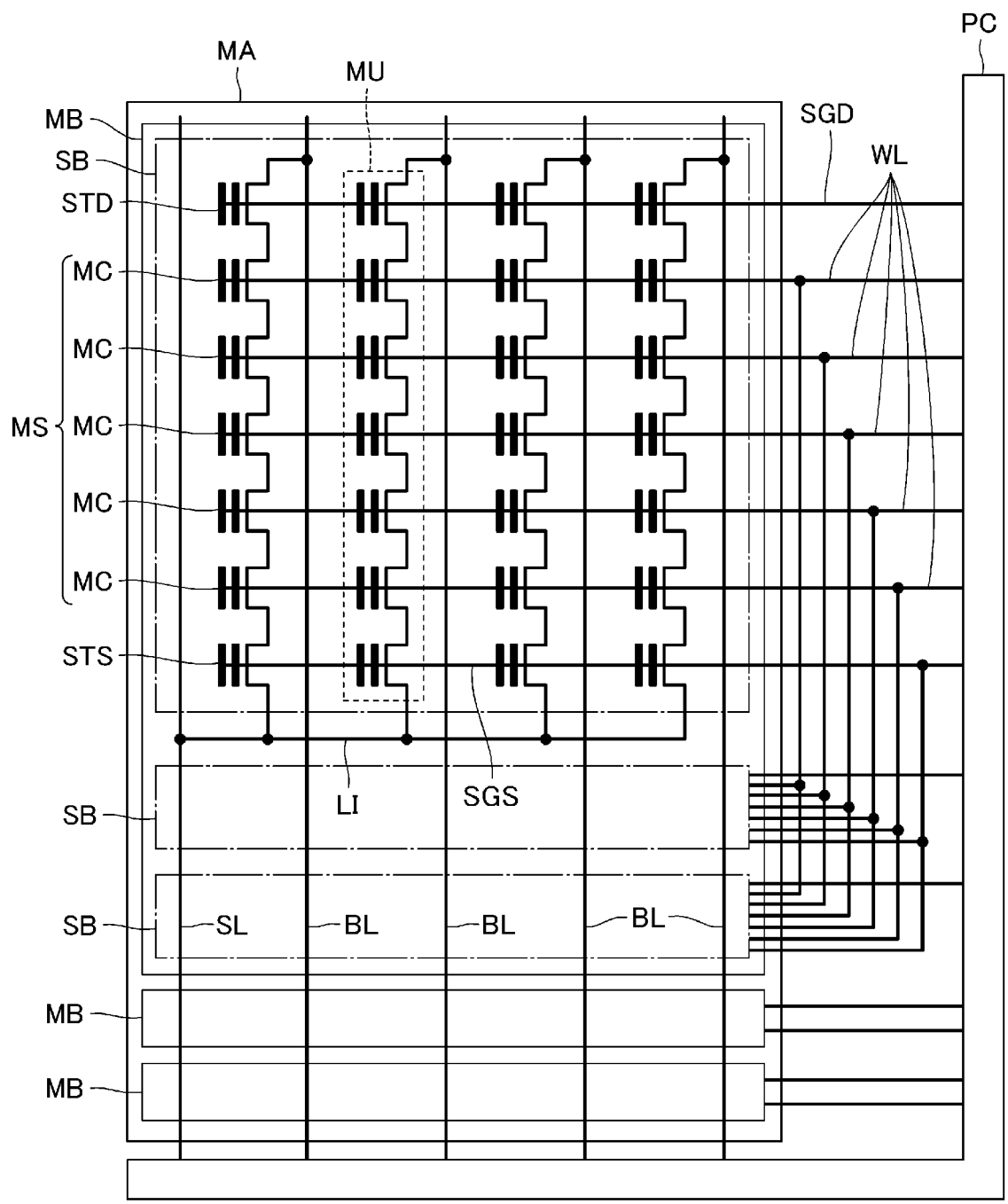
FIG. 1 is a schematic equivalent circuit diagram of a semiconductor memory device according to a first embodiment.

Embodiments provide a semiconductor memory device capable of high integration and high speed.

In general, according to an embodiment, a semiconductor memory device includes a substrate, a plurality of gate electrodes arranged in a thickness direction of the substrate, a first semiconductor layer, a gate insulating film, a second semiconductor layer, and a first contact. The first semiconductor layer extends in the thickness direction and faces the plurality of gate electrodes. The gate insulating film is between the plurality of gate electrodes and the first semiconductor layer. The second semiconductor layer is between the substrate and the plurality of gate electrodes and connected to a side surface of the first semiconductor layer in a surface direction along a surface of the substrate. The first contact extending in the thickness direction and electrically connected to the second semiconductor layer. The second semiconductor layer includes a first region in contact with the side surface of the first semiconductor layer in the surface direction and containing P-type impurities, and a first contact region electrically connected to the first contact and having a higher concentration of N-type impurities than the first region.

According to another embodiment, a semiconductor memory device includes a substrate, a plurality of gate electrodes arranged in a thickness direction of the substrate, a first semiconductor layer, a gate insulating film, a second semiconductor layer, and a first contact. The plurality of gate electrodes is arranged in a thickness direction of the substrate. The first semiconductor layer extends in the thickness direction and faces the plurality of gate electrodes. The gate insulating film is between the plurality of gate electrodes and the first semiconductor layer. The second semiconductor layer is between the substrate and the plurality of gate electrodes and connected to a side surface of the first semiconductor layer in a surface direction along a surface of the substrate. The first contact extends in the thickness direction and electrically connected to the second semiconductor layer. The second semiconductor layer includes a first region in contact with the side surface of the first semiconductor layer in the surface direction, a second region between the first region and the plurality of gate electrodes and having a higher concentration of P-type impurities than the first region, and a first contact region electrically connected to the first contact and having a higher concentration of N-type impurities than the first region.

A semiconductor memory device according to embodiments will be described in detail with reference to the drawings. The following embodiments are merely examples, and are not illustrated for the purpose of limiting the present disclosure.

Further, in the present specification, a predetermined direction parallel to a surface of a substrate is referred to as an X-direction, a direction parallel to the surface of the substrate and perpendicular to the X-direction is referred to as a Y-direction, and a direction perpendicular to the surface of the substrate is referred to as a Z-direction.

In the present specification, a direction along a predetermined surface may be referred to as a first direction, a direction along the predetermined surface and intersecting the first direction may be referred to as a second direction, and a direction intersecting the predetermined surface may be referred to as a third direction. The first direction, the second direction, and the third direction may or may not correspond to any of the X-direction, the Y-direction, and the Z-direction.

Further, in the present specification, expressions such as "upper" and "lower" are based on the substrate. For example, when the first direction intersects the surface of the substrate, the direction away from the substrate along the first direction is referred to as "upper", and the direction approaching the substrate along the first direction is referred to as "lower". For a certain configuration, when a lower surface or a lower end is referred to, it means a surface or an end portion on the substrate side in the configuration, and when an upper surface or an upper end is referred to, it means a surface or an end on a side opposite to the substrate in the configuration. Further, a surface intersecting with the second direction or the third direction is referred to as a side surface or the like.

Further, in the present specification, when a "radial direction" is referred to for a cylindrical or annular member or a through via hole, in a plane perpendicular to the central axis of the cylindrical or annular member, it means a direction approaching or away from this central axis of the cylindrical or annular member. Also, when a "thickness in the radial direction" or the like is referred to, it means the difference between the distance from the central axis to the inner circumferential surface and the distance from the central axis to the outer circumferential surface in such a plane.

In the present specification, when a "width" or "thickness" in a predetermined direction is referred to about a configuration, a members, and the like, it may mean the width or thickness in a cross section and the like observed by scanning electron microscopy (SEM), transmission electron microscopy (TEM), and the like.

First Embodiment

Configuration

FIG. 1 is a schematic equivalent circuit diagram of a semiconductor memory device according to a first embodiment. In FIG. 1, apart of a configuration is omitted for convenience of explanation.

The semiconductor memory device according to the present embodiment includes a memory cell array MA and a peripheral circuit PC that controls the memory cell array MA.

The memory cell array MA includes a plurality of memory blocks MB. Each of the plurality of memory blocks MB includes a plurality of sub-blocks SB. Each of the plurality of sub-blocks SB includes a plurality of memory units MU. One ends of the plurality of memory units MU are connected to the peripheral circuit PC through bit lines BL, respectively. Also, the other ends of the plurality of memory units MU are connected to the peripheral circuit PC through a common source contact LI and common source line SL, respectively.

Each memory unit MU includes a drain select transistor STD, a memory string MS, and a source select transistor STS connected in series between the bit line BL and the source contact LI. Hereinafter, the drain select transistor STD and the source select transistor STS may be simply referred to as select transistors (STD and STS).

The memory string MS includes a plurality of memory cells MC connected in series. The memory cell MC is a field effect transistor including a semiconductor film, a gate insulating film, and a gate electrode. The semiconductor film functions as a channel region. The gate insulating film includes a memory portion capable of storing data. The memory portion is, for example, an electric charge storage film such as a silicon nitride film (SiN) or a floating gate. In this case, a threshold voltage of the memory cell MC changes in accordance with an amount of electric charge in the electric charge storage film. The gate electrode is connected to a word line WL. Word lines WL are provided corresponding to a plurality of memory cells MC belonging to one memory string MS, and are commonly connected to all the memory strings MS in one memory block MB.

The select transistor (STD and STS) is a field effect transistor including a semiconductor film, a gate insulating film, and a gate electrode. The semiconductor film functions as a channel region. The gate electrode of the drain select transistor STD is connected to a drain select line SGD. The drain select line SGD is provided corresponding to the sub-block SB, and is commonly connected to all drain select transistors STD in one sub-block SB. The gate electrodes of the source select transistors STS are connected to a source select line SGS. The source select line SGS is commonly connected to all the source select transistors STS in one memory block MB.

The peripheral circuit PC generates, for example, voltages necessary for a read operation, a write operation, and an erase operation, and applies the voltages to the bit line BL, the source line SL, the word line WL, and the select gate lines (SGD and SGS). The peripheral circuit PC includes, for example, a plurality of transistors and wirings provided on the same chip as the memory cell array MA.

Figure 2:
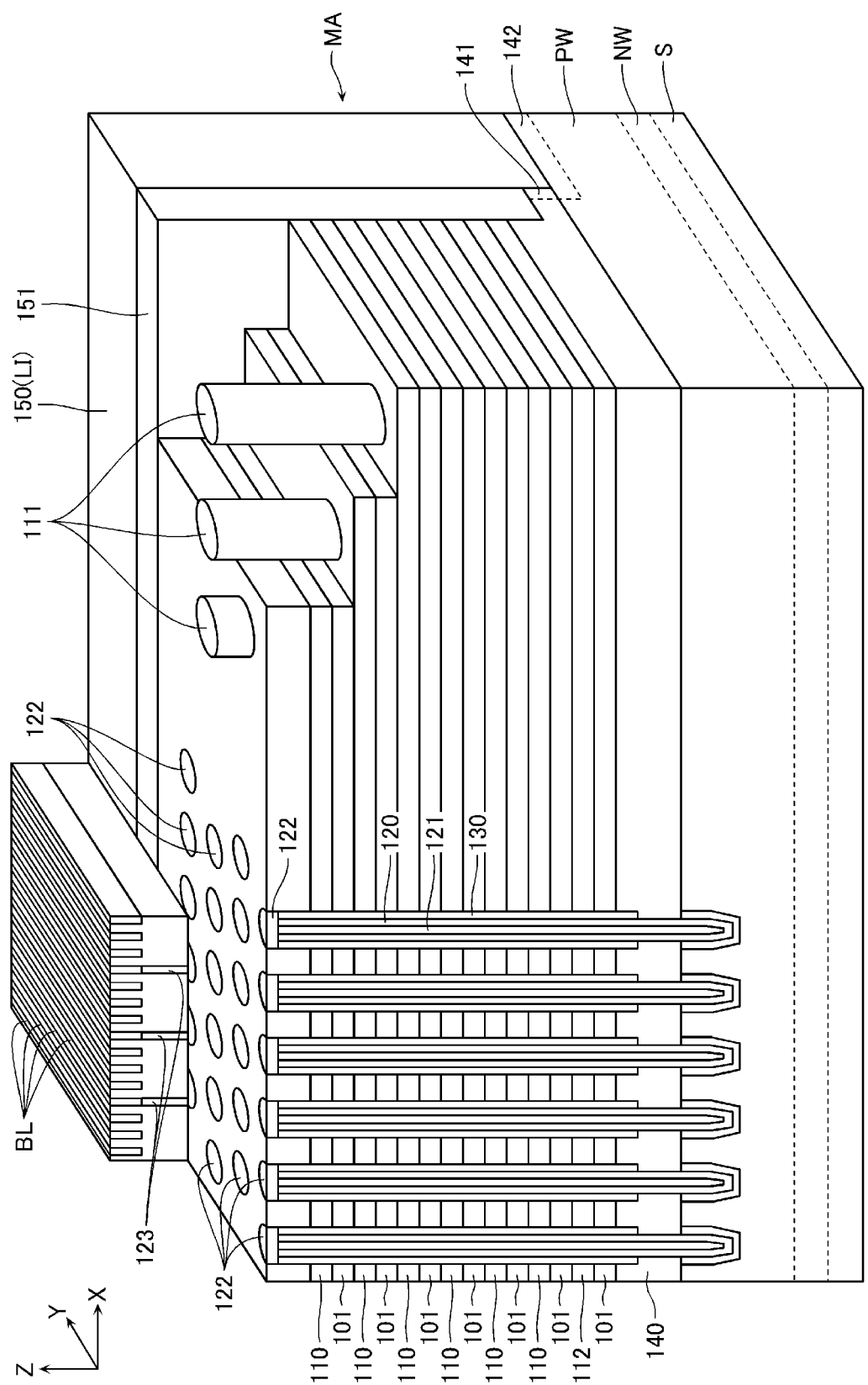
FIG. 2 illustrates a schematic perspective view of apart of the semiconductor memory device.
Figure 3:
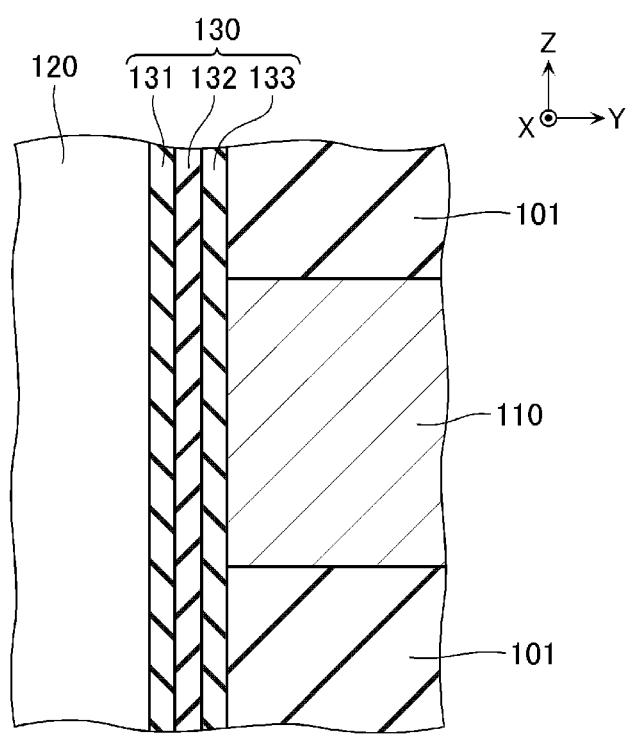
FIG. 3 illustrates an enlarged view of a part of FIG. 2.

FIG. 2 illustrates a schematic perspective view of the semiconductor memory device according to the present embodiment. FIG. 3 illustrates an enlarged view of a part of FIG. 2. For convenience of explanation, a part of the configuration is omitted in FIGS. 2 and 3.

As illustrated in FIG. 2, the semiconductor memory device according to the present embodiment includes a substrate S, a plurality of conductive layers 110 arranged in the Z-direction, and a plurality of semiconductor layers 120 extending in the Z-direction and facing the plurality of conductive layers 110, and gate insulating films 130 provided between the conductive layers 110 and the semiconductor layers 120. The semiconductor memory device includes a semiconductor layer 140 provided below the plurality of conductive layers 110 and commonly connected to the outer peripheral surface of the plurality of semiconductor layers 120, and a conductive layer 150 extends in the Z-direction and the X-direction and connected to the semiconductor layer 140.

The substrate S is, for example, a semiconductor substrate made of single crystal silicon (Si) or the like. The substrate S has, for example, a double well structure having an N-type well NW containing N-type impurities on the surface of the semiconductor substrate, and further having a P-type well PW containing P-type impurities in the N-type well NW.

Each conductive layer 110 includes, for example, a stacked film of titanium nitride (TiN) and tungsten (W). Each conductive layer 110 functions as, for example, the word line WL (FIG. 1) and gate electrodes of a plurality of memory cells MC connected to the word line WL, or functions as, for example, the drain selection line SGD (FIG. 1) and gate electrodes of a plurality of drain select transistors STD (FIG. 1) connected to the drain selection line SGD. An end portion of each conductive layer 110 in the X-direction is connected to the peripheral circuit PC (FIG. 1) through a contact 111 extending in the Z-direction.

A conductive layer 112 is provided between the conductive layer 110 and the semiconductor layer 140. The conductive layer 112 includes, for example, polycrystalline silicon (Si) containing N-type impurities such as phosphorus (P). The conductive layer 112 functions as the source select line SGS (FIG. 1) and gate electrodes of a plurality of source select transistors STS (FIG. 1) connected to the source select line SGS.

Between the plurality of conductive layers 110 adjacent in the Z-direction, between the conductive layer 110 and the conductive layer 112, and between the conductive layer 112 and the semiconductor layer 140, insulating layers 101 such as silicon oxide ($SiO_2$) are provided. The conductive layers 110, the conductive layer 112, and the insulating layers 101 have a plurality of through via holes formed in a predetermined pattern, and the inner peripheral surface of each through via hole faces the outer peripheral surface of each semiconductor layer 120.

The semiconductor layer 120 functions as a channel region of the plurality of memory cells MC, the drain select transistor STD, and the source select transistor STS in one memory unit MU (FIG. 1). The semiconductor layer 120 has a substantially cylindrical shape extending in the Z-direction. The semiconductor layer 120 is a semiconductor layer made of, for example, non-doped polycrystalline silicon (Si). In the central portion of the semiconductor layer 120, an insulating layer 121 made of silicon oxide ($SiO_2$) or the like is embedded. The lower end portion of the semiconductor layer 120 is connected to the semiconductor layer 140. The upper end of the semiconductor layer 120 is connected to the bit line BL through the semiconductor layer 122 and the contact 123. The semiconductor layer 122 is, for example, a conductive semiconductor film into which n-type impurities such as phosphorus (P) are implanted. The contact 123 contains, for example, tungsten (W), copper (Cu) or the like.

The gate insulating film 130 has a substantially cylindrical shape covering the outer peripheral surface and the bottom surface of the semiconductor layer 120. For example, as illustrated in FIG. 3, the gate insulating film 130 includes a tunnel insulating film 131, an electric charge storage film 132, and a block insulating film 133 provided from the semiconductor layer 120 side to the conductive layer 110 side. The tunnel insulating film 131 is an insulating film made of, for example, silicon oxide ($SiO_2$). The electric charge storage film 132 is an insulating film made of, for example, silicon nitride (SiN). The block insulating film 133 may be an insulating film made of, for example, silicon oxide ($SiO_2$), or may be an insulating stacked film. FIG. 3 illustrates an example in which the gate insulating film 130 is an insulating electric charge storage film. However, the gate insulating film 130 may include a conductive electric charge storage film (floating gate) such as polycrystalline silicon (Si) containing impurities.

The semiconductor layer 140 (FIG. 2) contains, for example, polycrystalline silicon containing P-type impurities such as boron (B). The semiconductor layer 140 is connected to the P-type well PW on the surface of the substrate S. At a contact portion of the semiconductor layer 140 with the conductive layer 150, a contact region 141 including N-type impurities such as phosphorus (P) is provided. At a contact portion of the P-type well PW with the conductive layer 150, a contact region 142 containing N-type impurities such as phosphorus (P) is provided.

The conductive layer 150 extends in the Z-direction and the X-direction, and is connected to the substrate S and the semiconductor layer 140 at the lower end portion. The conductive layer 150 includes, for example, a stacked film of titanium nitride (TiN) and tungsten (W). The conductive layer 150 functions as the source contact LI.

Next, with reference to FIGS. 4 to 7, a more specific configuration of the memory cell array MA will be described. For convenience of explanation, a part of the configuration is omitted in FIGS. 4 to 7.

Figure 4:
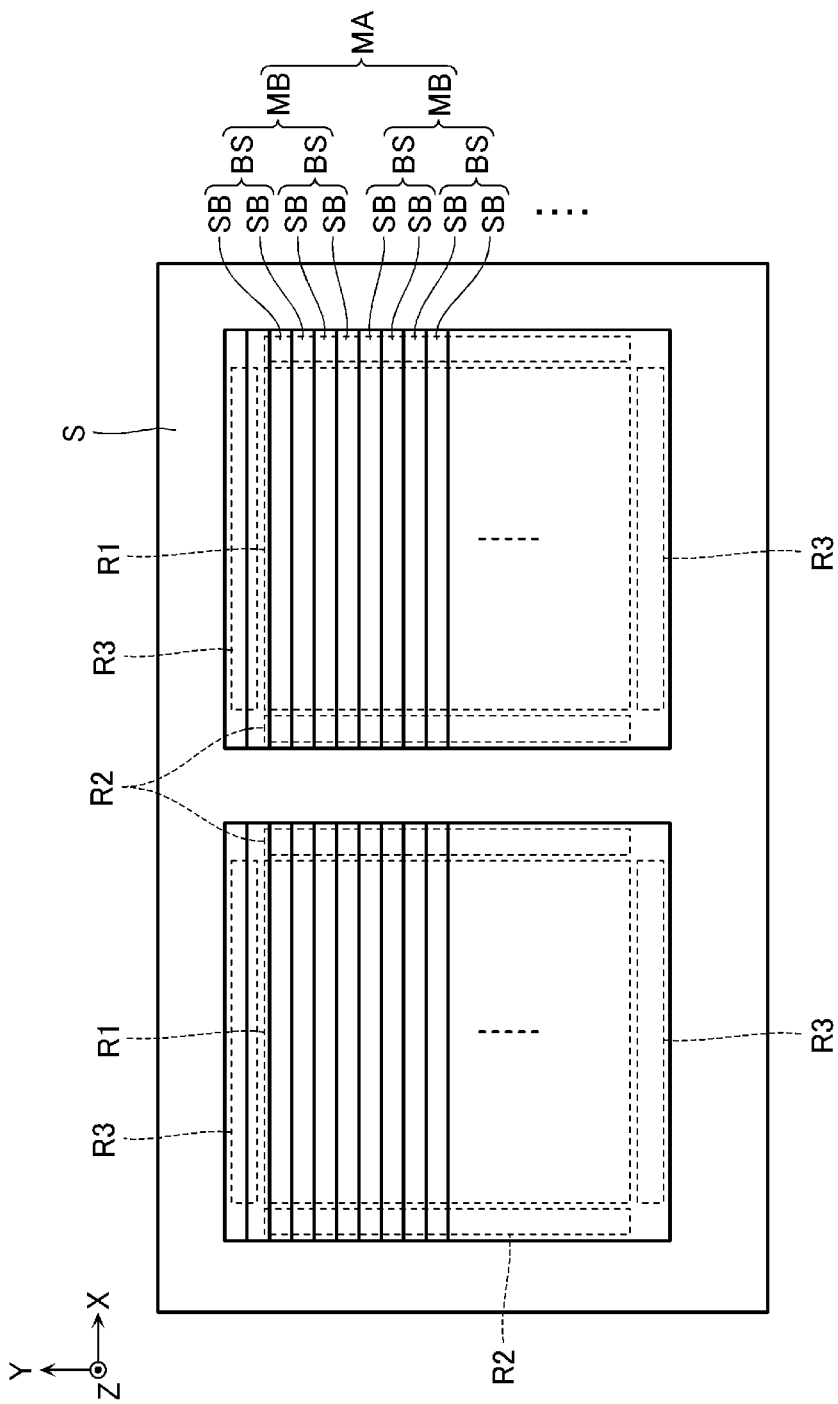
FIG. 4 illustrates a schematic plan view of a part of the semiconductor memory device.

FIG. 4 illustrates a schematic plan view of the semiconductor memory device according to the present embodiment.

As illustrated in FIG. 4, on the substrate S, a plurality of memory cell arrays MA are provided. In the illustrated example, two memory cell arrays MA are arranged in the X-direction on the substrate S. Each memory cell array MA includes a plurality of memory blocks MB arranged in the Y-direction. Each of the plurality of memory blocks MB includes a plurality of block structures BS arranged in the Y-direction. Each of the plurality of block structures BS includes a plurality of sub-blocks SB arranged in the Y-direction.

In each memory cell array MA, a region R1 in which the memory cells MC are provided, a region R2 provided at both end portions of memory cell array MA in the X-direction and extending in the Y-direction, and a region R3 provided at both end portions of memory cell array MA in the Y-direction and extending in the X-direction are provided. For example, the contact 111 or the like is provided in the region R2.

Figure 5:
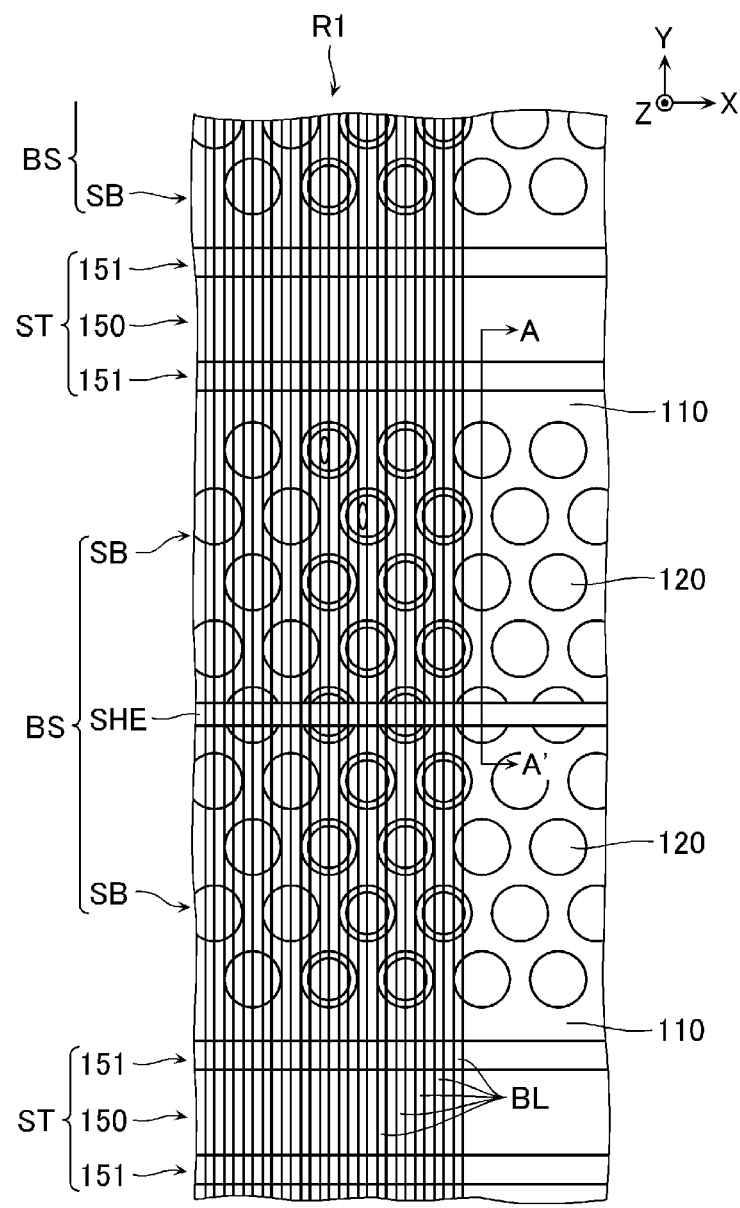
FIG. 5 illustrates an enlarged view of a part of FIG. 4.

FIG. 5 illustrates an enlarged view of a part of FIG. 4, and illustrates a part of the region R1.

In the region R1, the plurality of block structures BS and block division structures ST are alternately arranged side by side.

Each block structure BS includes two sub-blocks SB adjacent in the Y-direction through an insulating portion SHE. In each sub-block SB, a plurality of semiconductor layers 120 are arranged in a zigzag. Each of the plurality of semiconductor layers 120 is connected to the bit line BL and functions as the memory unit MU (FIG. 1).

Each block division structure ST includes the conductive layer 150 and insulating layers 151 each of which is made of silicon oxide ($SiO_2$) or the like and is provided between the conductive layer 150 and the block structure BS. The length of the conductive layer 150 and the insulating layer 151 in the X-direction may be, for example, equal to or greater than the length of the block structure BS in the X-direction.

A plurality of bit lines BL are provided in the X-direction and extend in the Y-direction. Each bit line BL is connected to one semiconductor layer 120 for one sub-block SB.

Figure 6:
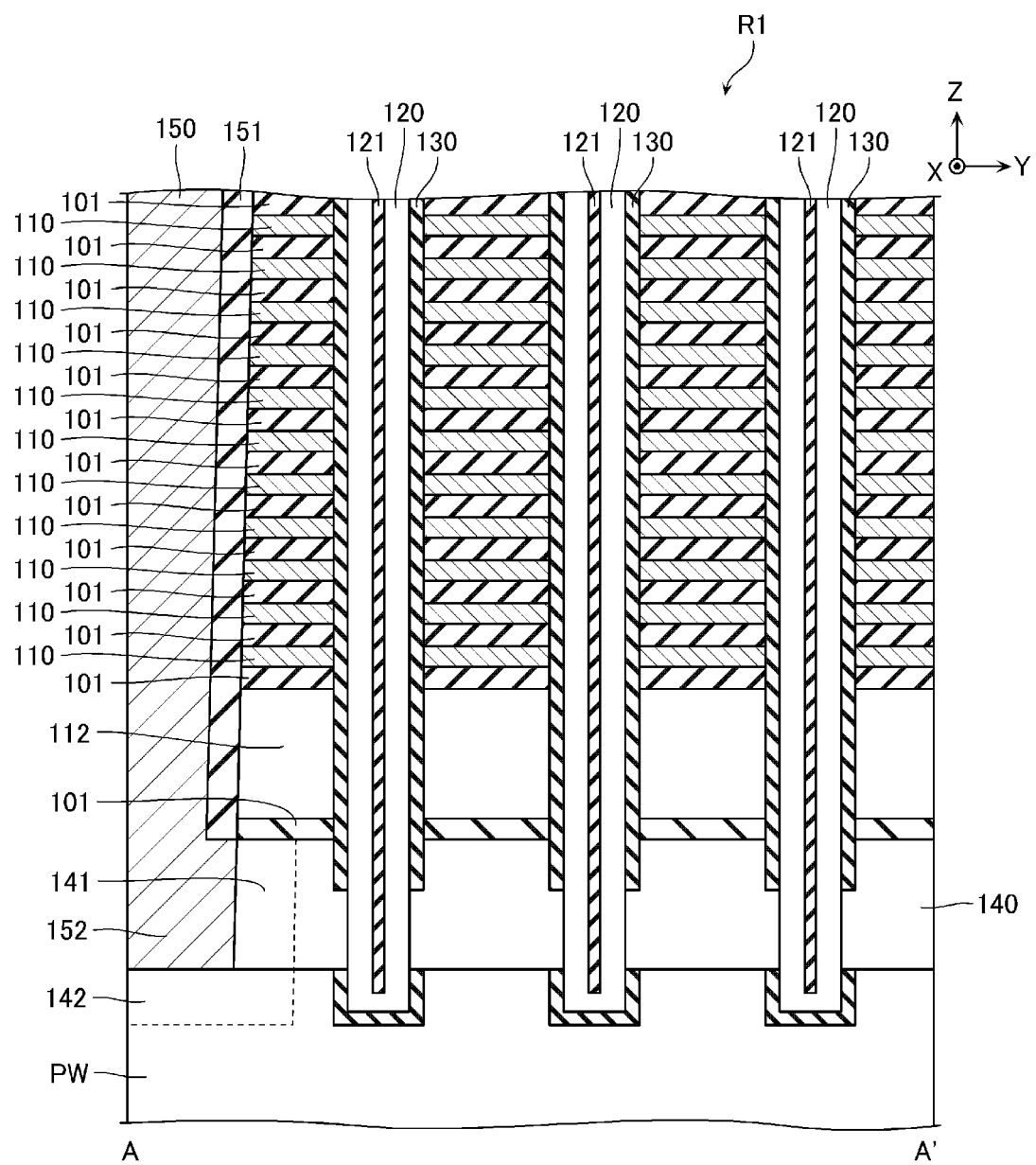
FIG. 6 illustrates a schematic cross-sectional view taken along line A-A' in FIG. 5.

FIG. 6 illustrates a schematic cross-sectional view of a structure illustrated in FIG. 5 taken along line A-A' and viewed in the direction of the arrow.

As illustrated in FIG. 6, in the present embodiment, the lower end portion 152 of the conductive layer 150 protrudes in the Y-direction along the upper surface of the P-type well PW and the lower surface of the insulating layer 151, and is connected to the P-type well PW on the lower surface and to the semiconductor layer 140 on the side surface in the Y-direction. Further, the contact region 141 of the semiconductor layer 140 and the contact region 142 of the P-type well PW are provided in a range spreading substantially isotropically from the contact surface with the lower end portion 152 of the conductive layer 150. In the illustrated example, the upper end of the contact region 141 reaches the upper surface of the semiconductor layer 140. The thickness of the conductive layer 112 in the Z-direction is larger than the thickness of the conductive layer 110 in the Z-direction.

Figure 7:
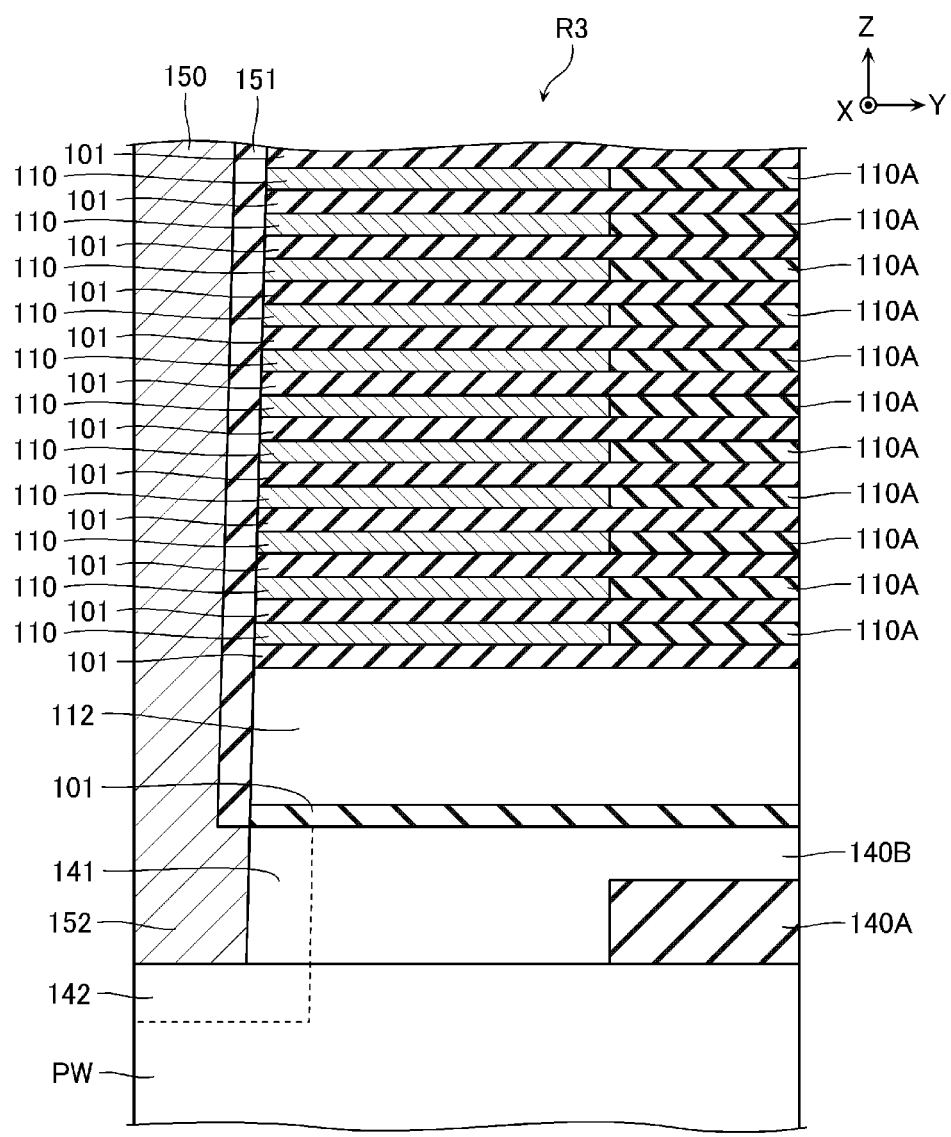
FIG. 7 illustrates a schematic cross-sectional view of a part of the semiconductor memory device.

FIG. 7 illustrates a cross-sectional view of a part of the region R3 (FIG. 4). In the present embodiment, a plurality of sacrificial layers 110A stacked in the Z-direction are provided in the region R3. Each sacrificial layer 110A includes, for example, silicon nitride (SiN) or the like. The sacrificial layer 110A is provided in the same layer as the conductive layer 110. That is, the conductive layer 110 and the sacrificial layer 110A are provided between two insulating layers 101 adjacent in the Z-direction. Further, in the region R3, a sacrificial layer 140A and a semiconductor layer 140B arranged in the Z-direction are provided. The sacrificial layer 140A contains, for example, silicon nitride (SiN) or the like. The semiconductor layer 140B contains, for example, polycrystalline silicon (Si) containing P-type impurities such as boron (B). The sacrificial layer 140A and the semiconductor layer 140B are provided in the same layer as the semiconductor layer 140. That is, the conductive layer 110 and the sacrificial layer 110A are provided between the lowermost insulating layer 101 and the P-type well PW.

Manufacturing Method

Next, with reference to FIGS. 8 to 22, a method of manufacturing the semiconductor memory device according to the present embodiment will be described.

Figure 8:
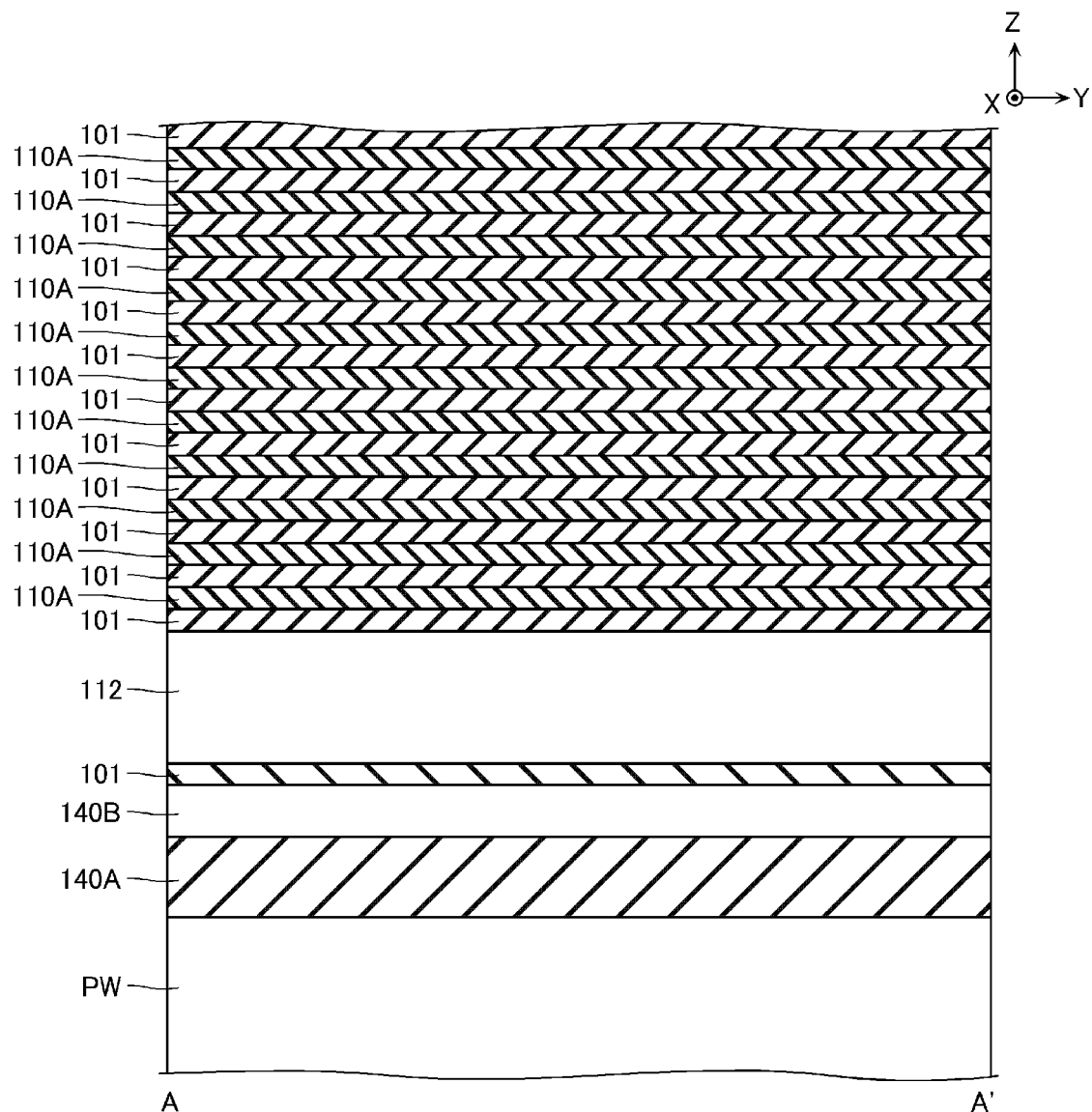
FIGS. 8-22 are schematic cross-sectional views of a structure to illustrate a method of manufacturing the semiconductor memory device according to the first embodiment.

As illustrated in FIG. 8, in the manufacturing method, the sacrificial layer 140A, the semiconductor layer 140B, the insulating layer 101, and the conductive layer 112 are formed on the P-type well PW of the substrate S. In addition, a plurality of insulating layers 101 and a plurality of sacrificial layers 110A are alternately formed above the layers. These steps are performed, for example, by a method such as chemical vapor deposition (CVD).

Figure 9:
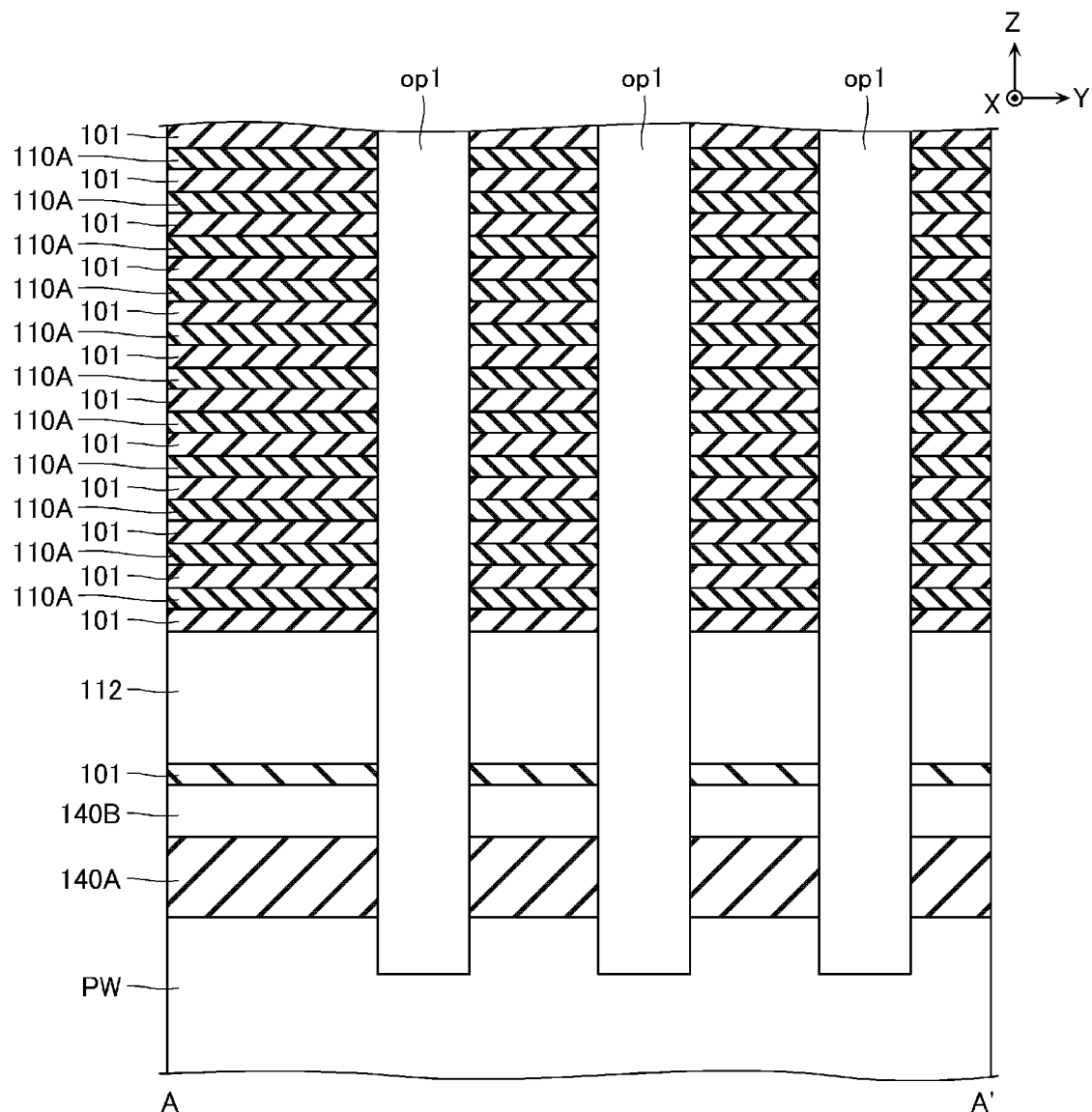

Next, as illustrated in FIG. 9, openings op1 are formed. Each opening op1 is an opening which extends in the Z-direction and penetrates the sacrificial layer 140A, the semiconductor layer 140B, the insulating layer 101, the conductive layer 112, and the plurality of insulating layers 101 and sacrificial layers 110A to expose the P-type well PW of the substrate S. This step is performed, for example, by a method such as reactive ion etching (RIE).

Figure 10:
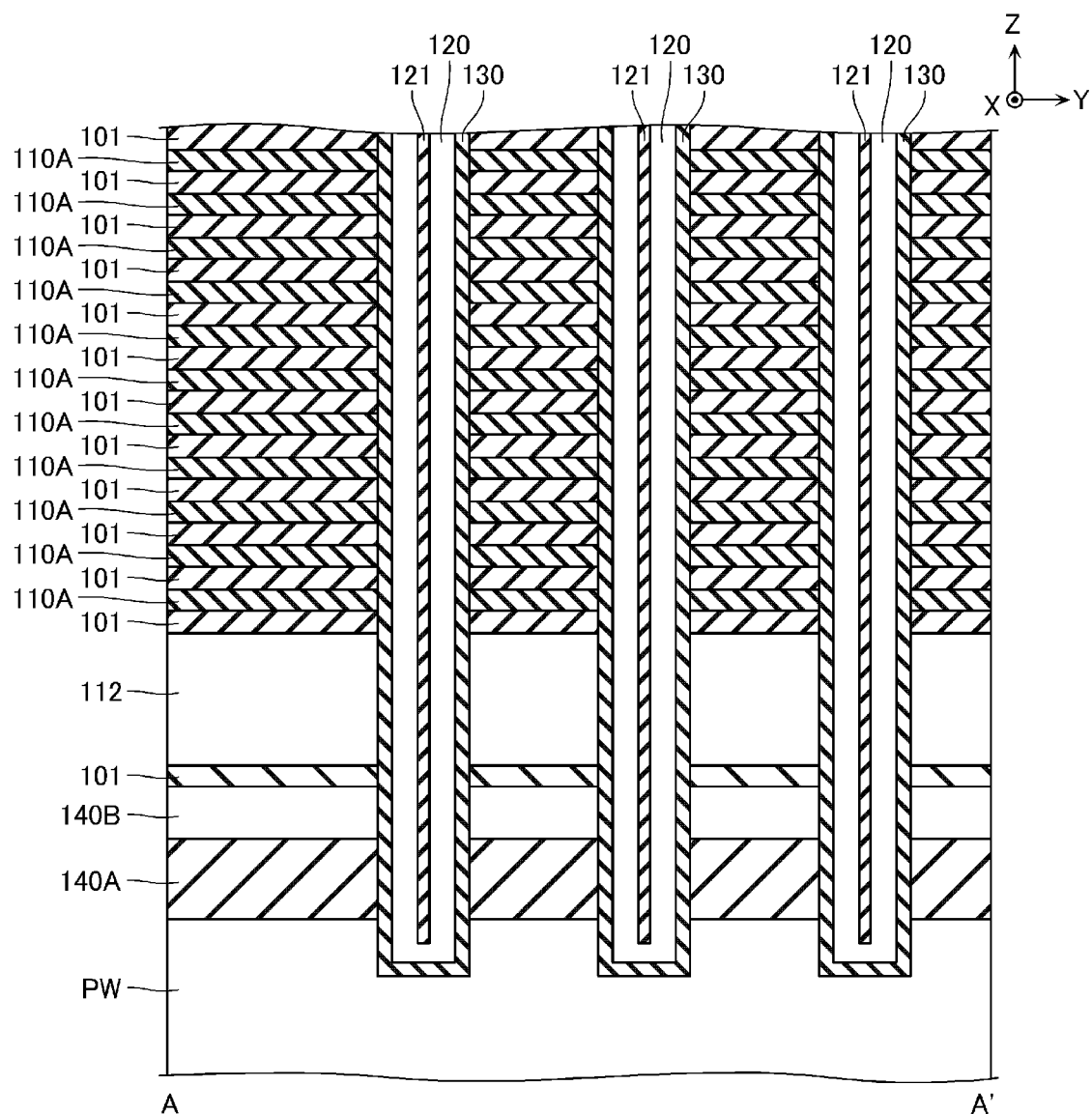

Next, as illustrated in FIG. 10, the gate insulating film 130, the semiconductor layer 120, and the insulating layer 121 are formed on the inner peripheral surface and the bottom surface of each opening op1. This step is performed, for example, by a method such as CVD. In this step, for example, heat treatment for modifying a crystal structure of the semiconductor layer 120 is performed.

Figure 11:
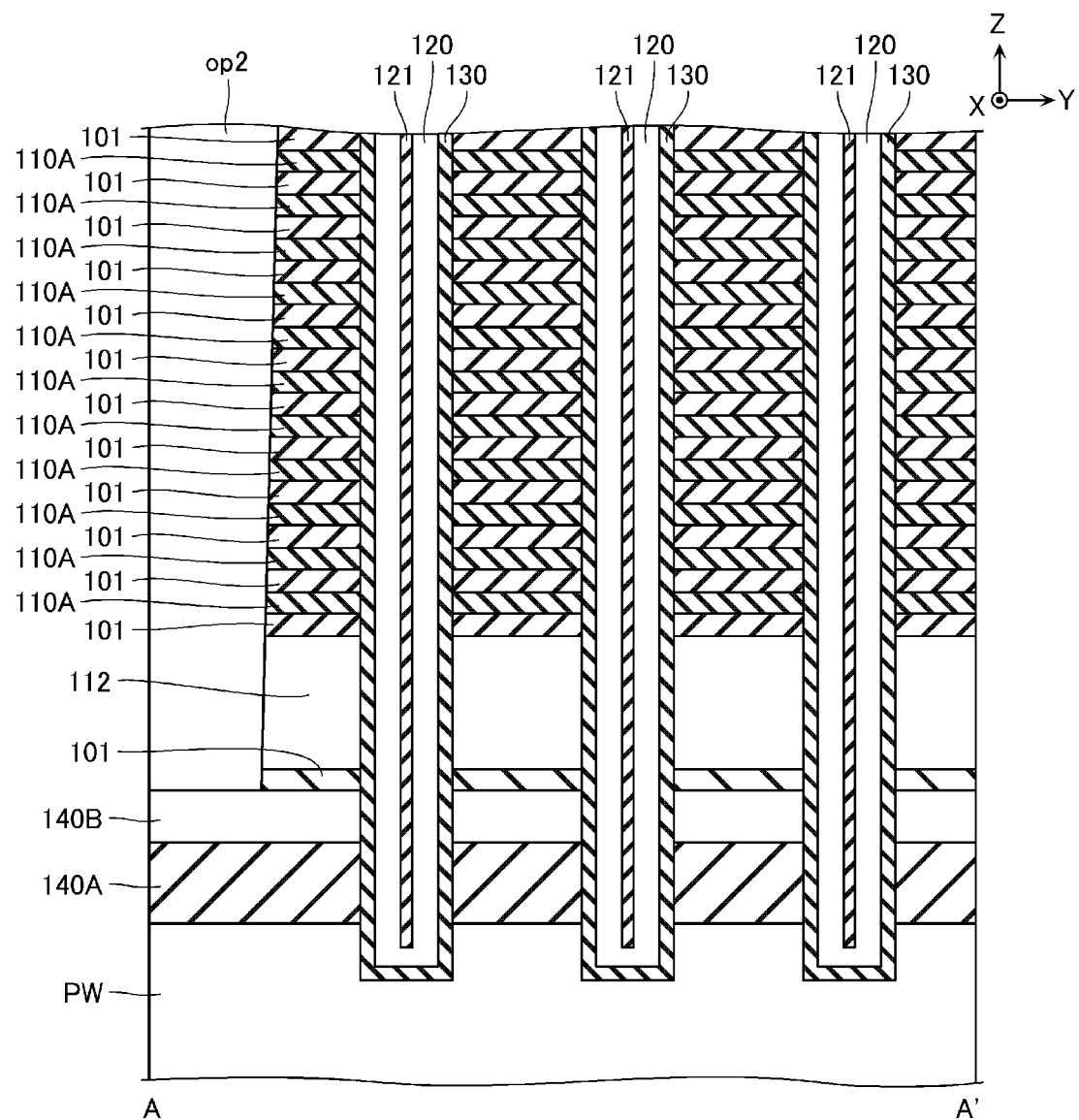

Next, as illustrated in FIG. 11, an opening op2 is formed. The opening op2 is an opening which extends in the X-direction and the Z-direction and divides the plurality of insulating layers 101, the plurality of sacrificial layers 110A, the conductive layer 112, and the insulating layer 101 in the Y-direction to expose the semiconductor layer 140B. This step is performed, for example, by a method such as RIE.

Figure 12:
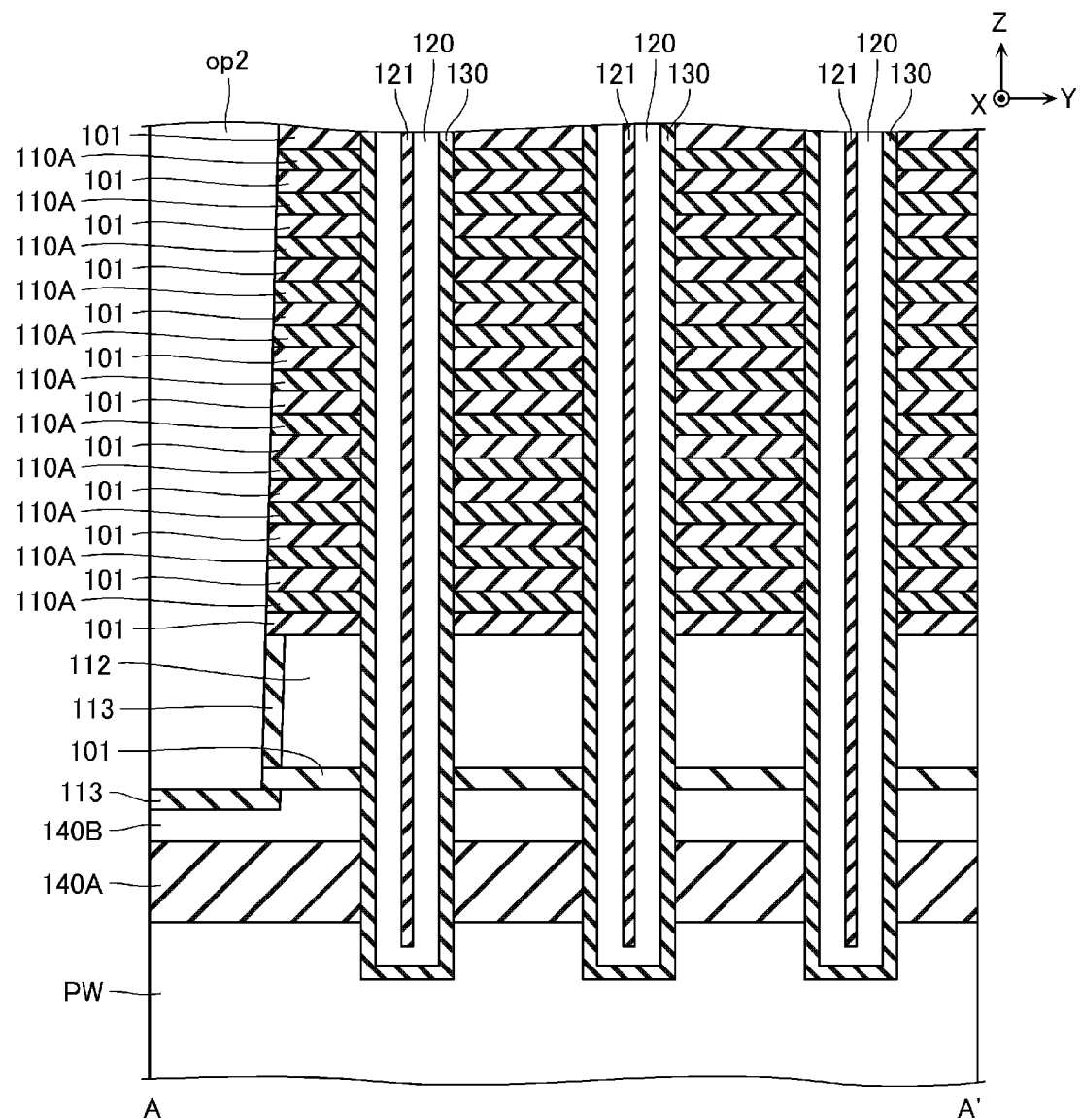

Next, as illustrated in FIG. 12, an oxide layer 113 is formed on the side surface of the conductive layer 112 in the Y-direction and the upper surface of the semiconductor layer 140B. This step is performed, for example, under the condition that silicon nitride is not oxidized and polycrystalline silicon is selectively oxidized.

Figure 13:
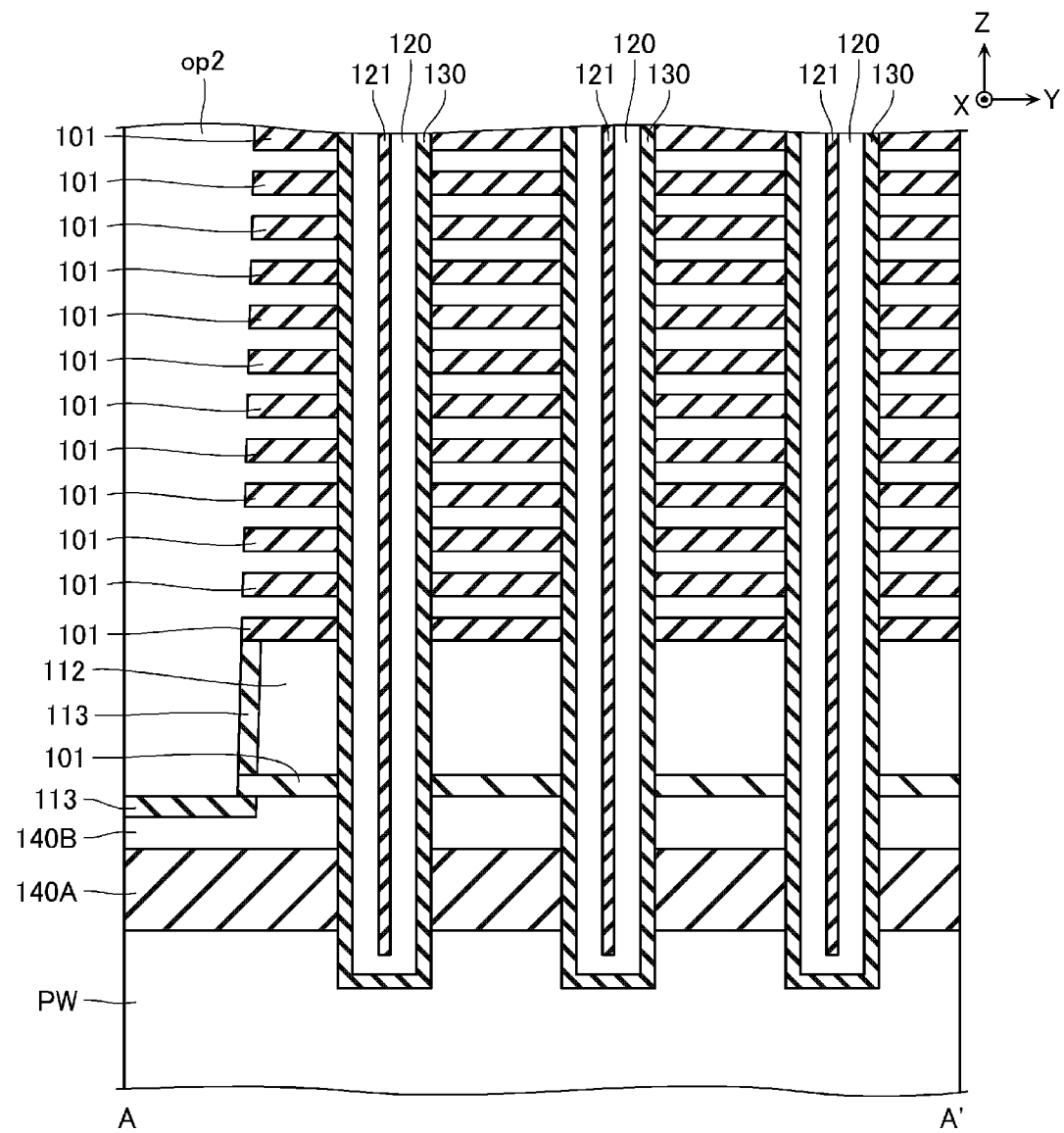

Next, as illustrated in FIG. 13, the sacrificial layers 110A are removed. This step is performed under the condition that silicon oxide is not removed but silicon nitride is selectively removed, such as wet etching using phosphoric acid.

Figure 14:
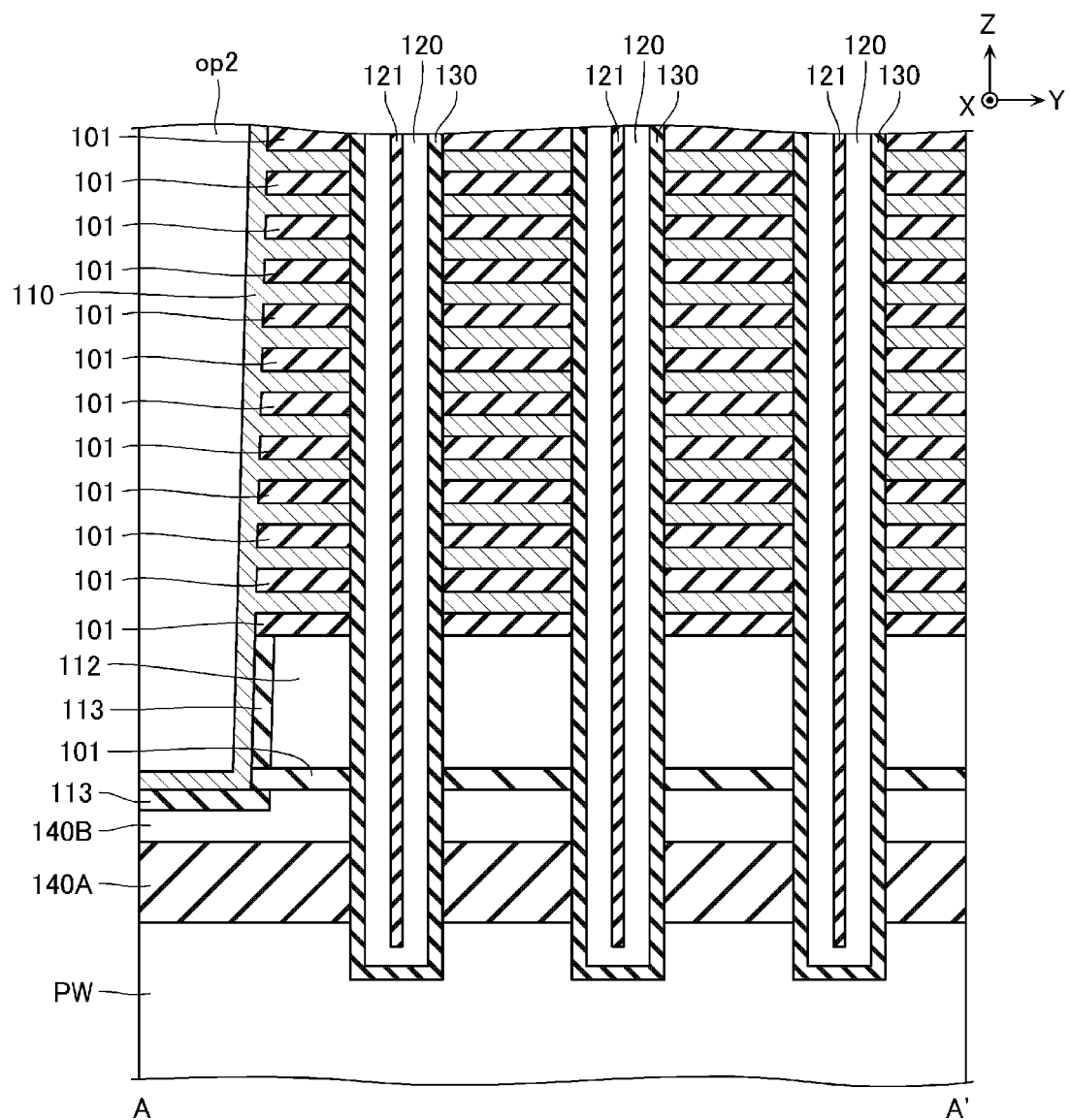

Next, as illustrated in FIG. 14, the conductive layer 110 is formed. This step is performed by, for example, the CVD.

Figure 15:
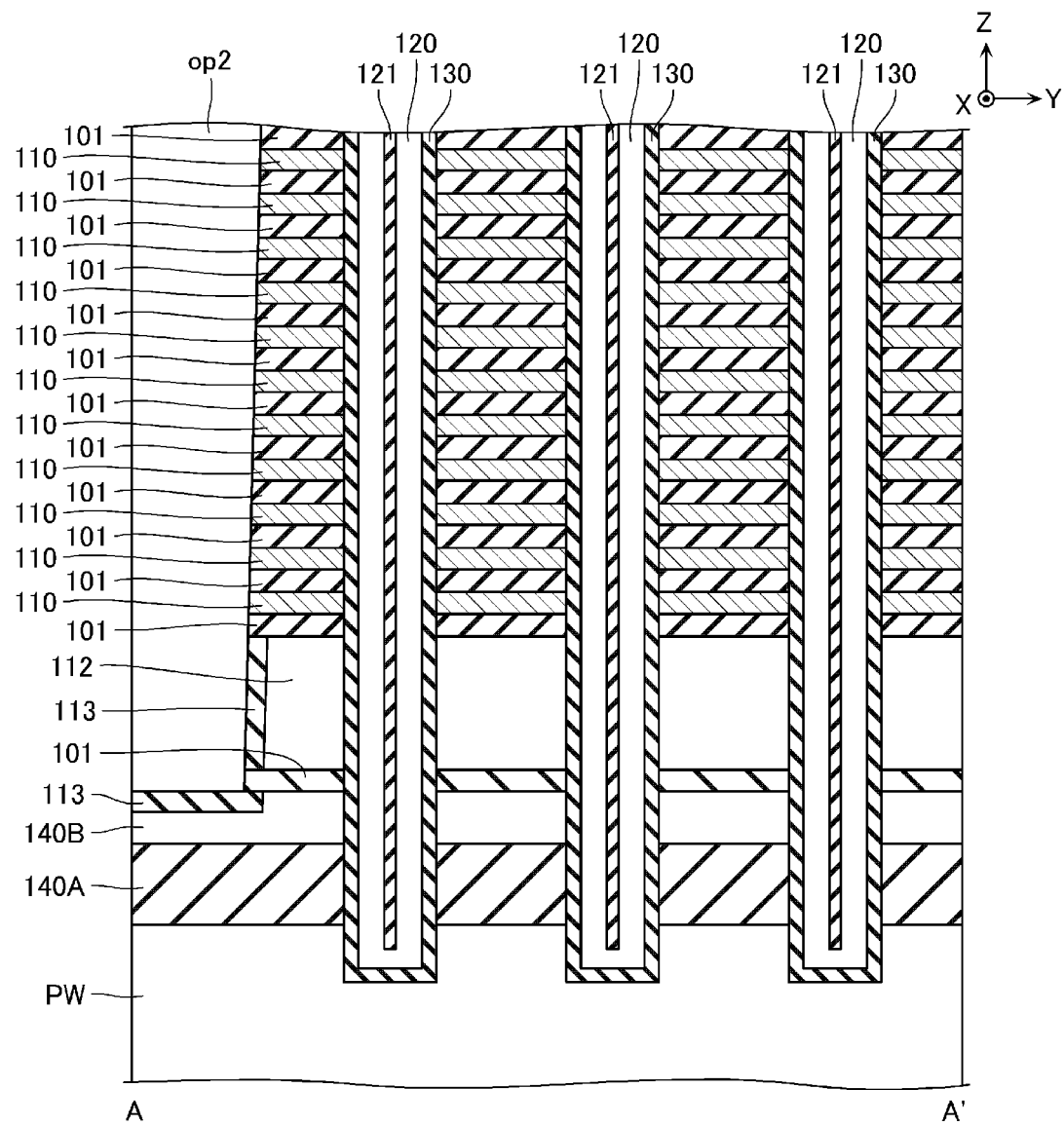

Next, as illustrated in FIG. 15, apart of the conductive layer 110 is removed to divide the plurality of conductive layers 110 in the Z-direction. This step is performed, for example, by wet etching or the like.

Figure 16:
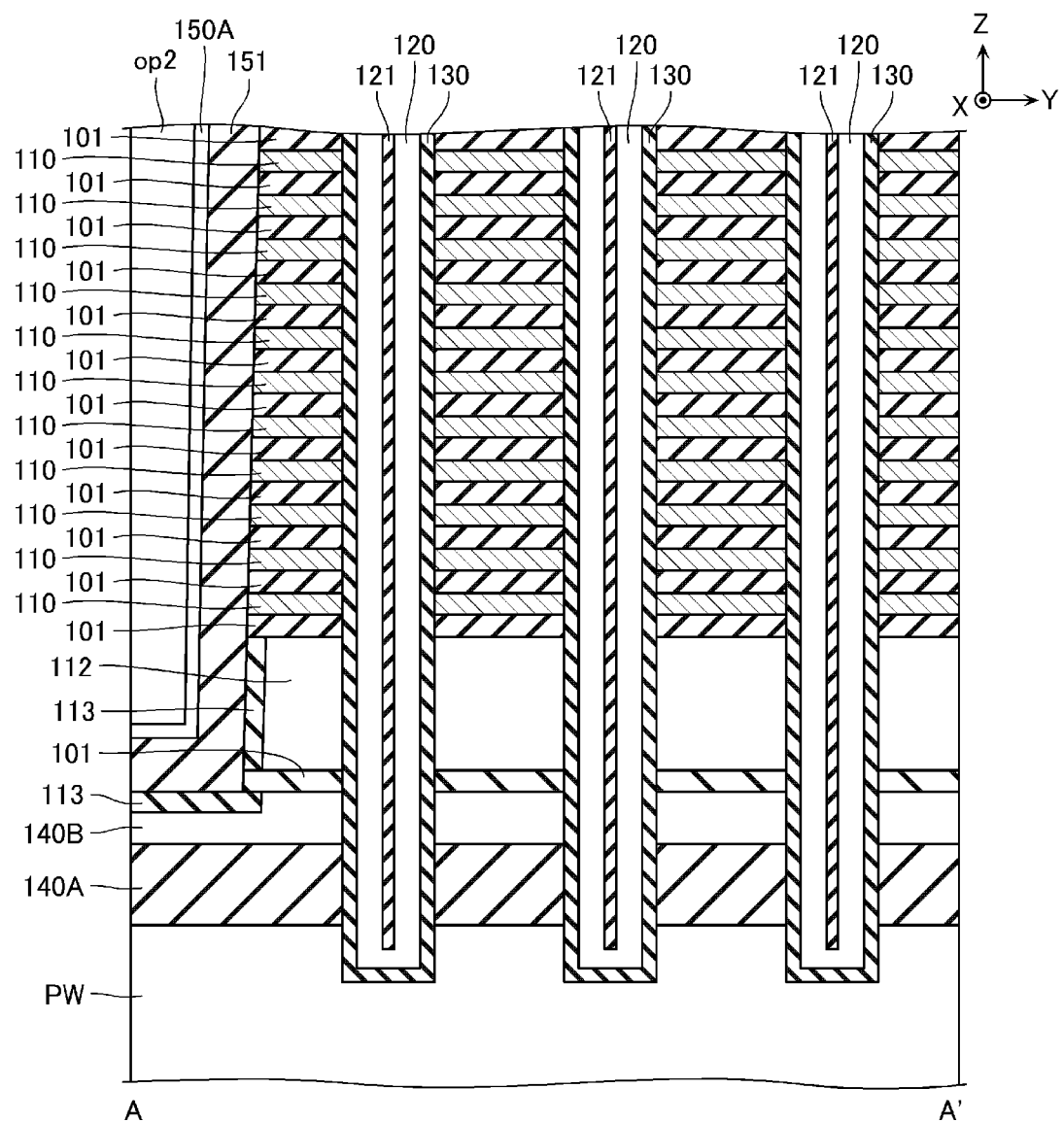

Next, as illustrated in FIG. 16, the insulating layer 151 and a semiconductor layer 150A are formed on the side surface and the bottom surface of the opening op2. This step is performed, for example, by a method such as CVD.

Figure 17:
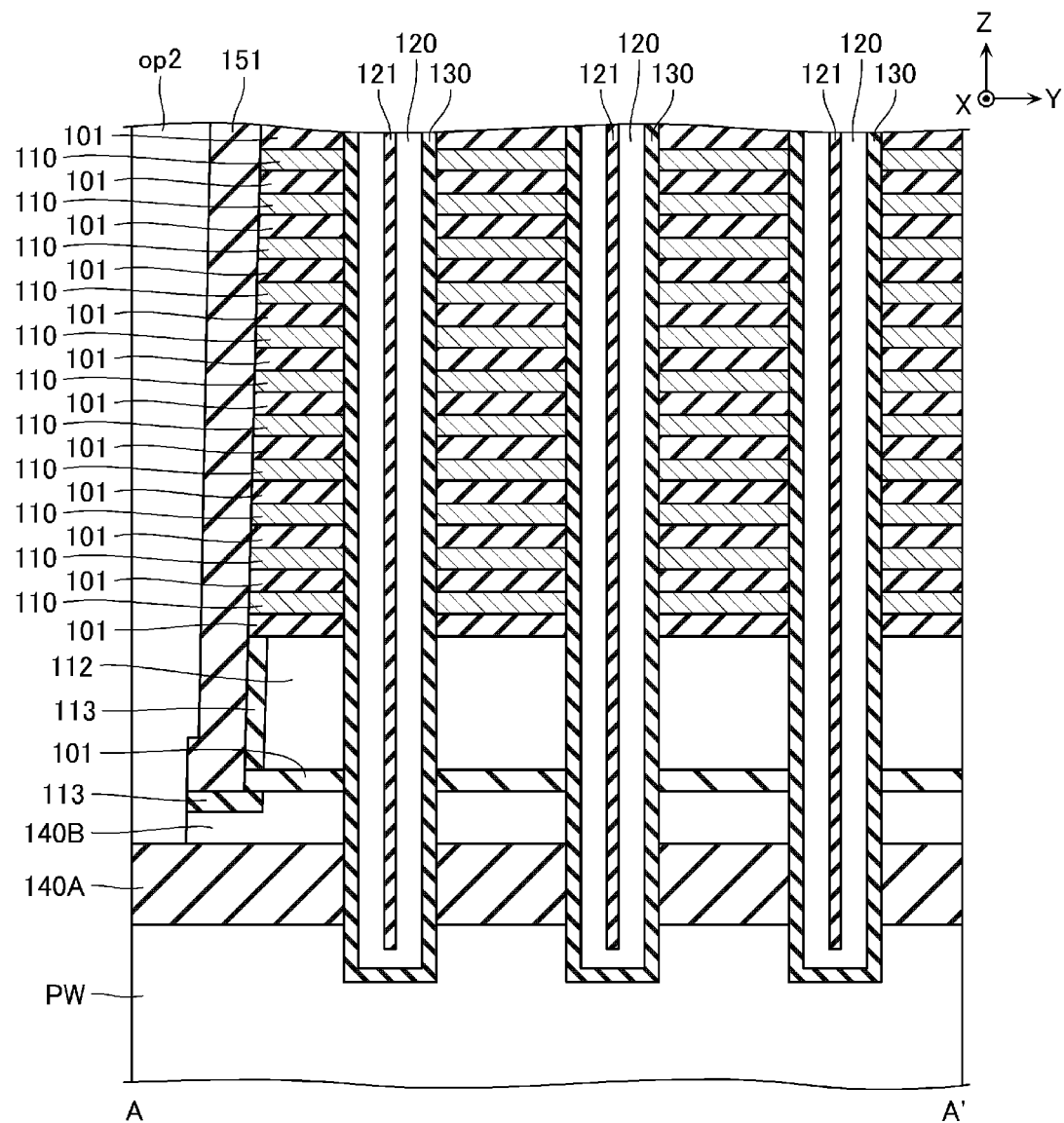

Next, as illustrated in FIG. 17, a portion of the insulating layer 151 and the semiconductor layer 150A formed on the bottom of the opening op2 is removed and a part of the semiconductor layer 140B is removed to expose the upper surface of the sacrificial layer 140A. This step is performed, for example, by a method such as RIE.

Figure 18:
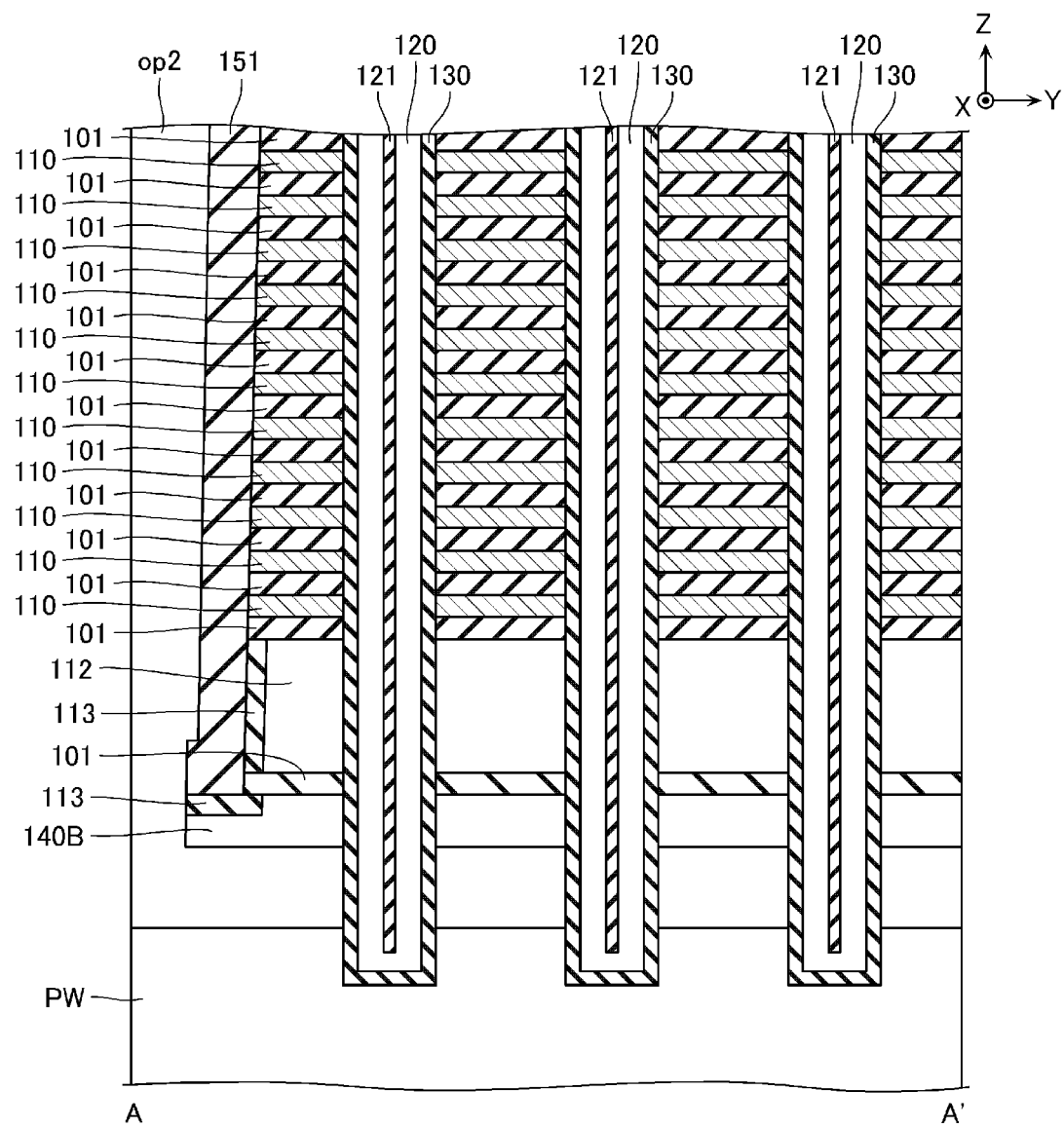

Next, as illustrated in FIG. 18, the sacrificial layer 140A is removed to expose the upper surface of the P-type well PW, the lower surface of the semiconductor layer 140B, and the outer peripheral surface of the gate insulating film 130. This step is performed, for example, by conducting wet etching or the like under the condition that silicon and silicon oxide are not removed and silicon nitride is selectively removed.

Figure 19:
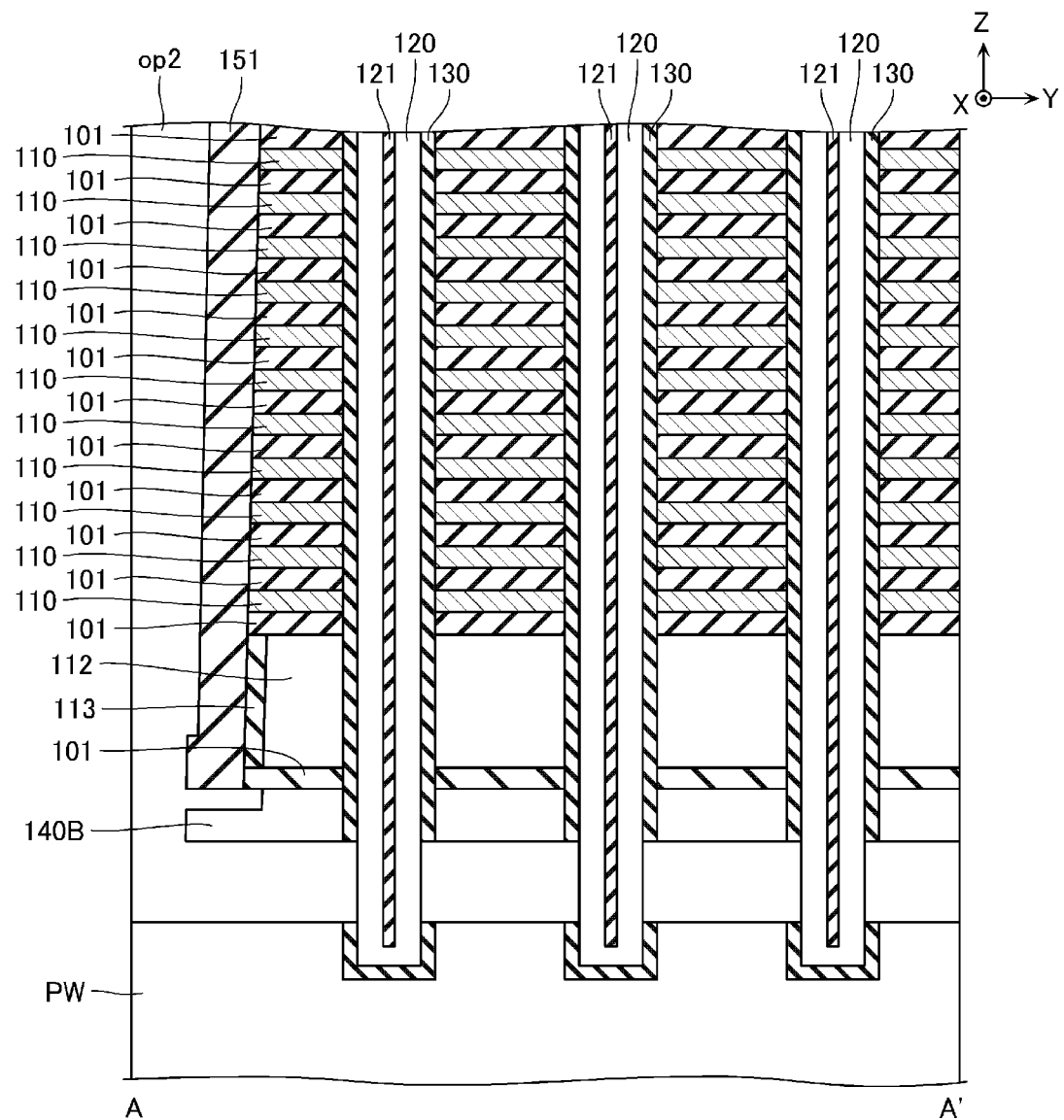

Next, as illustrated in FIG. 19, a part of the gate insulating film 130 is removed to expose a part of the outer peripheral surface of the semiconductor layer 120. This step is performed, for example, by wet etching or the like.

Figure 20:
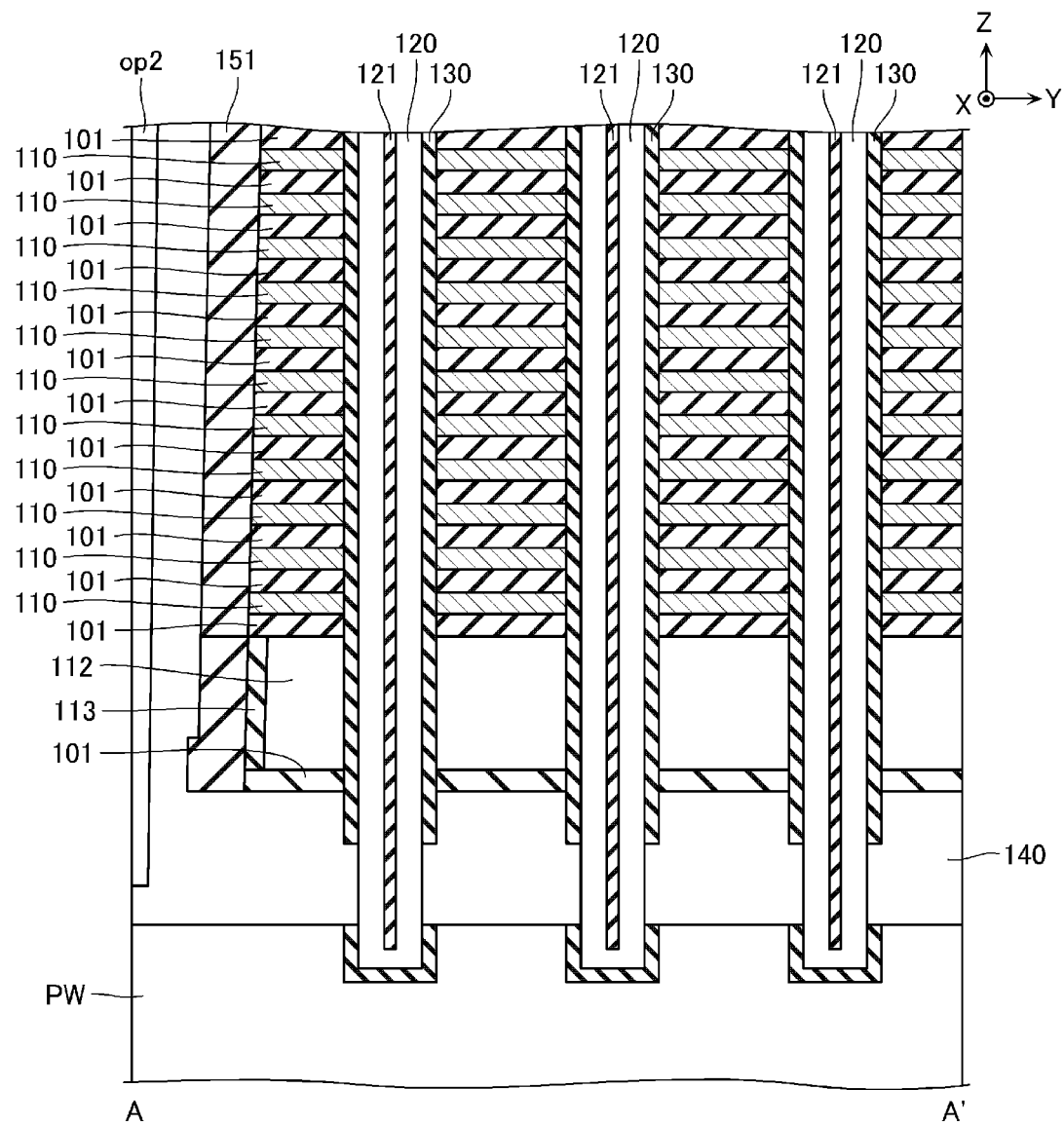

Next, as illustrated in FIG. 20, silicon or the like is formed on the upper surface of the P-type well PW, the lower surface of the semiconductor layer 140B, and the outer peripheral surface of the semiconductor layer 120 to form the semiconductor layer 140. This step is performed by, for example, the CVD.

Figure 21:
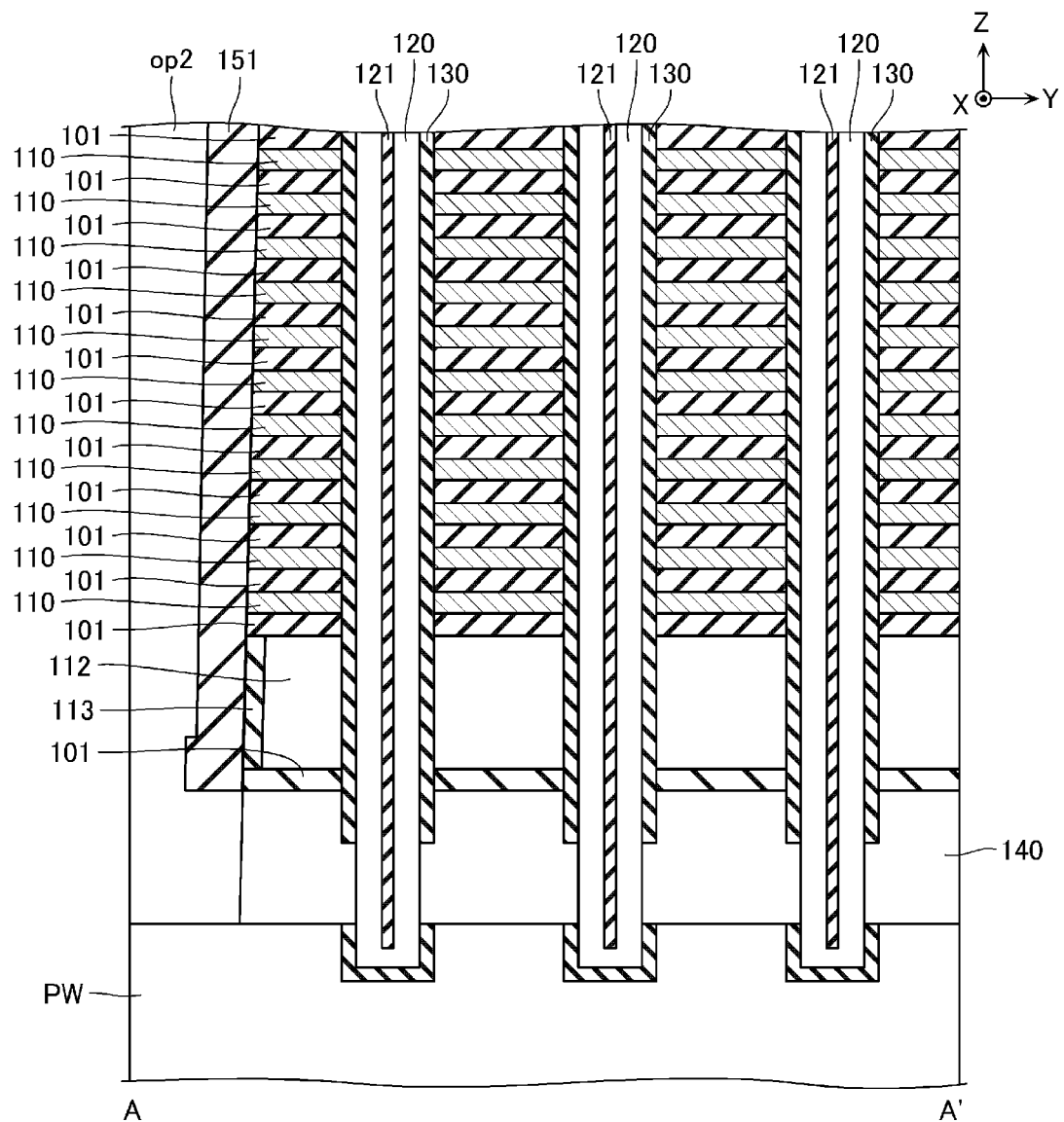

Next, as illustrated in FIG. 21, a part of the semiconductor layer 140 is removed to expose the side surface of the insulating layer 151. This step is performed by, for example, a method such as wet etching.

Figure 22:
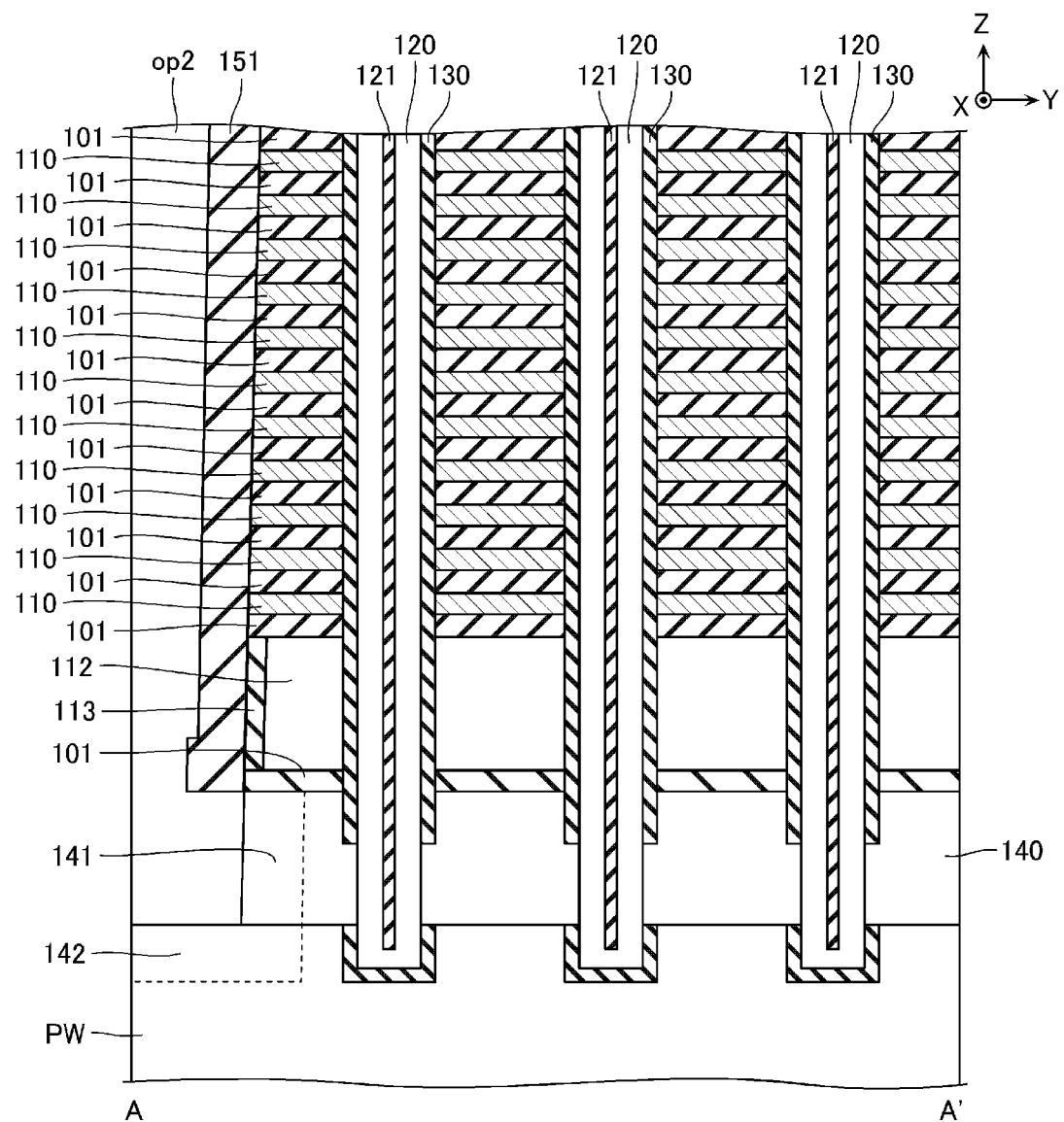

Next, as illustrated in FIG. 22, the N-type impurities such as phosphorus are implanted into the semiconductor layer 140 and the P-type well PW to form the contact region 141 of the semiconductor layer 140 and the contact region 142 of the P-type well PW. This step may be performed, for example, by a method such as ion implantation, or may be performed by a method such as vapor-phase doping.

Thereafter, the source contact LI is formed inside the opening opt by a method such as CVD to form the structure illustrated in FIG. 6.

Effects

A semiconductor memory device including a plurality of gate electrodes arranged in the Z-direction, a semiconductor layer extending in the Z-direction and facing the plurality of gate electrodes, and a gate insulating film provided between the gate electrode and the semiconductor layer is known. For example, as described with reference to FIGS. 9 and 10, such a semiconductor memory device is manufactured by forming the openings op1 each of which penetrates a plurality of sacrificial layers or conductive layers and forming the gate insulating film and the semiconductor layer on the inner peripheral surface of each opening op1.

In such a method, for example, as illustrated in FIG. 10, the gate insulating film is formed also at the lower end portion of the through via hole. Accordingly, in order to connect the lower end portion of the semiconductor layer to a wiring or the like, it is necessary to remove a part of the gate insulating film. As a method for this purpose, for example, it is conceivable to remove a part of the gate insulating film formed on the bottom surface of each opening op1 by a method such as RIE after forming the gate insulating film inside each opening op1 and thereafter form a semiconductor layer.

However, an aspect ratio of the opening op1 tends to increase with the high integration of the semiconductor memory device, and such a method is becoming difficult.

Therefore, in the first embodiment, as described with reference to FIG. 2 and the like, the outer peripheral surface of the semiconductor layer 120 is connected to the semiconductor layer 140 instead of connecting the lower end of the semiconductor layer 120 to the semiconductor layer 140. Such a structure may be provided by removing the gate insulating film 130 through the opening opt provided between the block structures BS, as described with reference to FIG. 19. Accordingly, higher integration can be achieved more easily compared to a case where the lower end of the semiconductor layer 120 is connected to the semiconductor layer 140.

In such a structure, for example, it is also conceivable to use the semiconductor layer 140 as an N-type semiconductor layer. In such a semiconductor memory device, electrons may be supplied from the source line SL to the memory cell MC in the read operation, and the resistance between the memory cell MC and the source line SL can be reduced by employing an N-type semiconductor layer as the semiconductor layer 140.

However, in such a semiconductor memory device, holes may be supplied to the memory cell MC in the erase operation. If the N-type semiconductor layer is employed as the semiconductor layer 140, for example, it is also conceivable that gate induced drain leakage (GIDL) is generated by the source select transistor STS and as a result, holes are generated. However, although it is necessary to control distribution of N-type impurities in the channel region of the source select transistor STS in order to perform the erase operation in such a method, such control may be difficult. The erase operation using the GIDL may not be suitable for speeding up the operation.

Accordingly, in the first embodiment, the semiconductor layer 140 is a P-type semiconductor layer. According to such a structure, holes can be supplied from the semiconductor layer 140 at the time of the erase operation, and the erase operation can be performed at a relatively high speed. Also, there is no problem in controlling distribution of N-type impurities in the channel region of the source select transistor STS.

In such a structure, in the read operation, a voltage is applied to the conductive layer 112 to form a channel of electrons on the top surface of the semiconductor layer 140 and the semiconductor layer 120 and the conductive layer 150 are connected through the channel. In such an aspect, a resistance value between the semiconductor layer 120 and the conductive layer 150 may be increased.

In the first embodiment, as described with reference to FIG. 5 and the like, each block structure BS is provided between two conductive layers 150 (source contacts LI) adjacent in the Y-direction. According to such a configuration, it is possible to make the distance between the semiconductor layer 120 and the conductive layer 150 relatively short. With this configuration, the resistance value between the semiconductor layer 120 and the conductive layer 150 in the read operation can be reduced, and the read operation can be performed at a relatively high speed.

Second Embodiment

Figure 23:
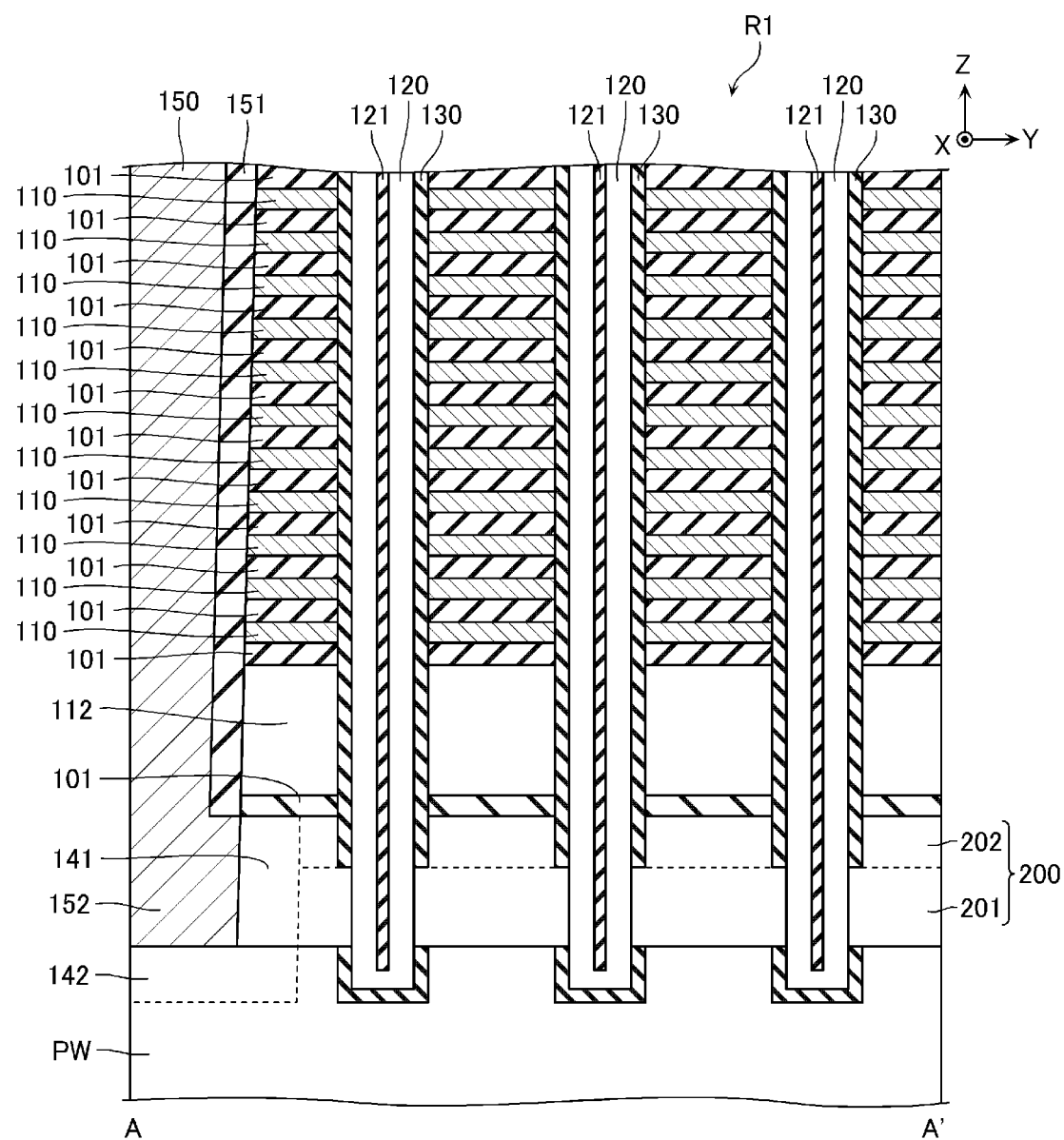
FIG. 23 illustrates a schematic cross-sectional view of a semiconductor memory device according to a second embodiment.

Next, a second embodiment will be described with reference to FIG. 23. FIG. 23 illustrates a schematic cross-sectional view of a semiconductor memory device according to the second embodiment. In the following description, the same parts as those of the first embodiment are denoted by the same reference numerals, and the description thereof is omitted.

The semiconductor memory device according to the second embodiment is basically configured in the same manner as the semiconductor memory device according to the first embodiment. However, the semiconductor memory device according to the second embodiment includes a semiconductor layer 200 instead of the semiconductor layer 140 (FIGS. 2 and 6).

The semiconductor layer 200 is basically configured in the same manner as the semiconductor layer 140, except that it includes a semiconductor region 201 connected to the outer peripheral surface of the P-type well PW and the semiconductor layer 120, and a semiconductor region 202 provided above the semiconductor region 201.

The semiconductor region 201 contains P-type impurities such as boron (B) and functions as a P-type semiconductor.

The semiconductor region 202 functions as an N-type or I-type semiconductor. Concentration of the P-type impurities in the semiconductor region 202 is at least smaller than the concentration of the P-type impurities in the P-type well PW and the semiconductor region 201. The semiconductor region 202 is connected to the contact region 141.

According to the semiconductor memory device of the present embodiment, the same effects as those of the semiconductor memory device of the first embodiment can be achieved.

Further, in the semiconductor memory device according to the present embodiment, the concentration of P-type impurities in the semiconductor region 202 is smaller than the concentration of P-type impurities in the semiconductor region 201. Accordingly, it is possible to further reduce the resistance value between the semiconductor layer 120 and the conductive layer 150 in the read operation.

The semiconductor memory device according to the present embodiment may be manufactured by substantially the same method as the semiconductor memory device according to the first embodiment. However, when manufacturing the semiconductor memory device according to the present embodiment, the steps described with reference to FIG. 8 are performed under the condition that the semiconductor layer 140B contains or does not contain the N-type impurities.

Third Embodiment

Figure 24:
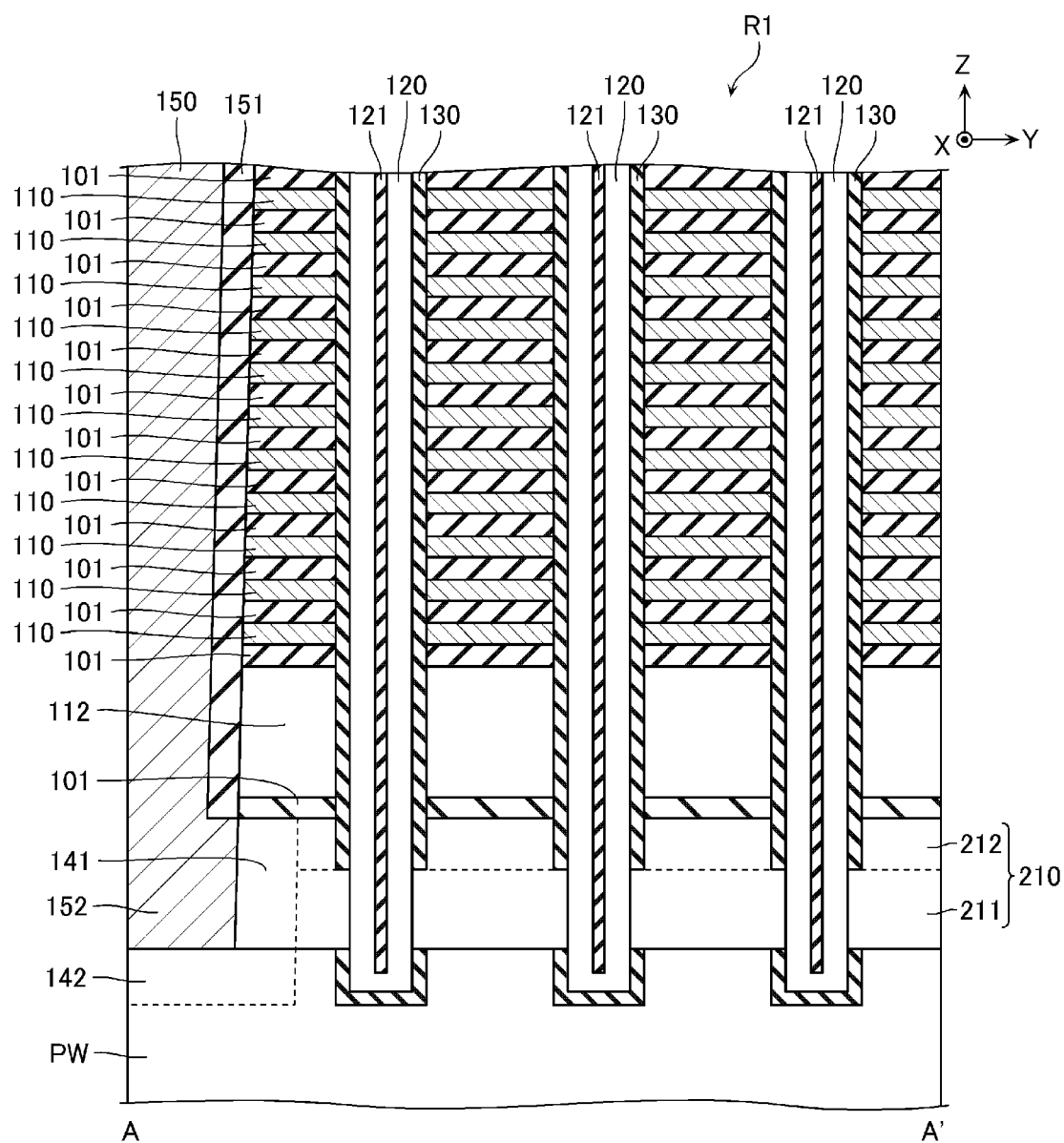
FIG. 24 illustrates a schematic cross-sectional view of a semiconductor memory device according to a third embodiment.

Next, a third embodiment will be described with reference to FIG. 24. FIG. 24 illustrates a schematic cross-sectional view of a semiconductor memory device according to the third embodiment. In the following description, the same parts as those of the first embodiment are denoted by the same reference numerals, and the description thereof is omitted.

The semiconductor memory device according to the third embodiment is basically configured in the same manner as the semiconductor memory device according to the first embodiment. However, the semiconductor memory device according to the third embodiment includes a semiconductor layer 210 instead of the semiconductor layer 140 (FIGS. 2 and 6).

The semiconductor layer 210 is basically configured in the same manner as the semiconductor layer 140, except that it includes a semiconductor region 211 connected to the outer peripheral surface of the P-type well PW and the semiconductor layer 120, and a semiconductor region 212 provided above the semiconductor region 211.

The semiconductor region 211 functions as an I-type semiconductor. The concentration of P-type impurities in the semiconductor region 211 is at least smaller than the concentration of P-type impurities in the P-type well PW. The concentration of the N-type impurities in the semiconductor region 211 is at least smaller than the concentration of the N-type impurities in the semiconductor region 212.

The semiconductor region 212 contains the N-type impurities such as phosphorus (P) and functions as an N-type semiconductor. The semiconductor region 212 is connected to the contact region 141.

According to the semiconductor memory device of the present embodiment, the same effects as those of the semiconductor memory device of the first embodiment can be achieved.

In the semiconductor memory device according to the present embodiment, the semiconductor region 212 functions as the N-type semiconductor. Accordingly, it is possible to further reduce the resistance value between the semiconductor layer 120 and the conductive layer 150 in the read operation.

The semiconductor memory device according to the present embodiment may be manufactured by substantially the same method as the semiconductor memory device according to the first embodiment. However, when manufacturing the semiconductor memory device according to the present embodiment, the steps described with reference to FIG. 8 are performed under the condition that the semiconductor layer 140B contains the N-type impurities. The step described with reference to FIG. 20 is performed under the condition that silicon formed in the steps does not contain impurities.

Fourth Embodiment

Figure 25:
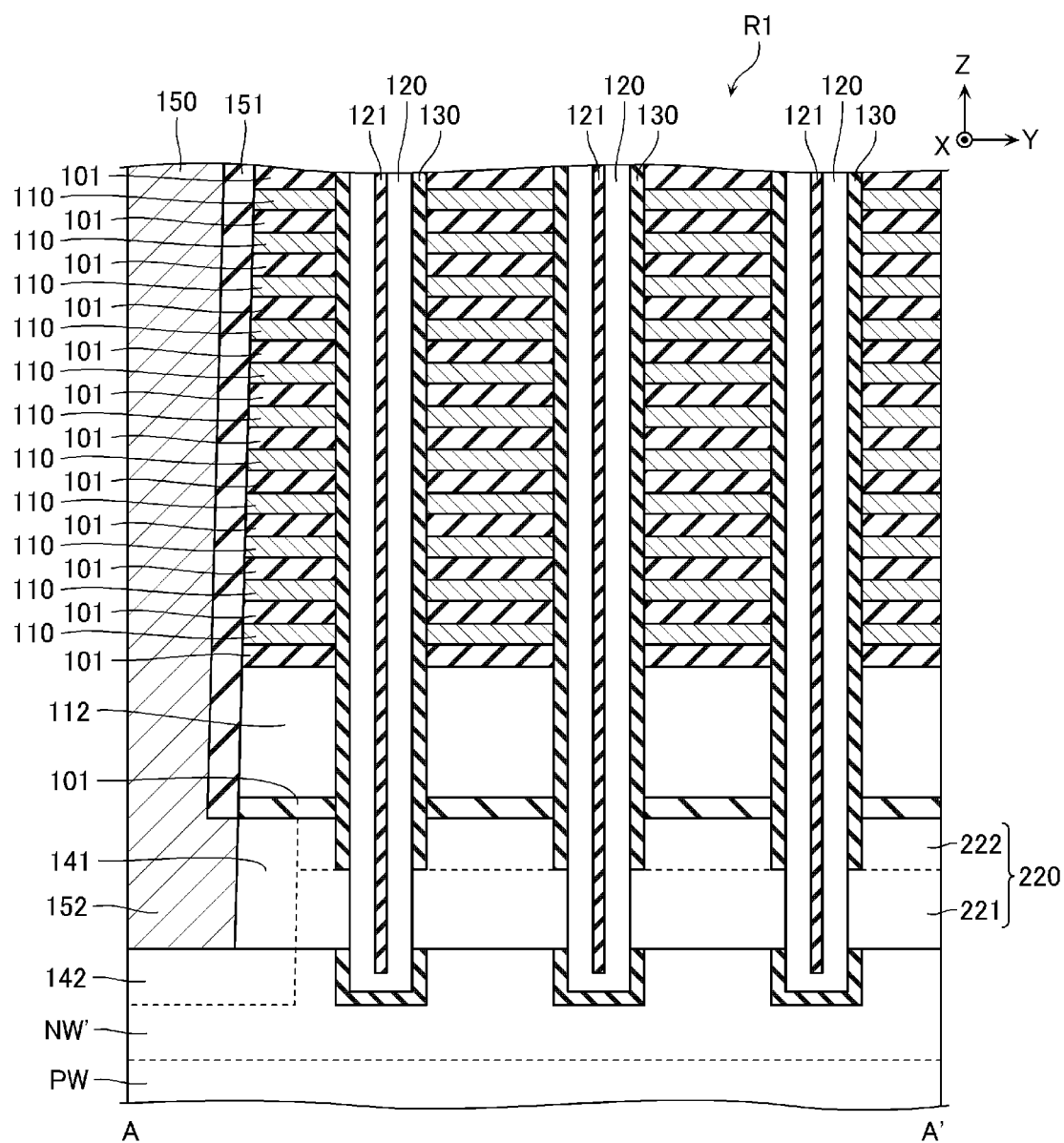
FIG. 25 illustrates a schematic cross-sectional view of a semiconductor memory device according to a fourth embodiment.

Next, a fourth embodiment will be described with reference to FIG. 25. FIG. 25 illustrates a schematic cross-sectional view of a semiconductor memory device according to the fourth embodiment. In the following description, the same parts as those of the first embodiment are denoted by the same reference numerals, and the description thereof is omitted.

The semiconductor memory device according to the fourth embodiment is basically configured in the same manner as the semiconductor memory device according to the first embodiment. However, the semiconductor memory device according to the fourth embodiment includes a substrate having a triple well structure in which an N-type well NW' further containing the N-type impurities is provided in the P-type well PW. The semiconductor memory device according to the fourth embodiment includes a semiconductor layer 220 instead of the semiconductor layer 140 (FIGS. 2 and 6).

The semiconductor layer 220 is basically configured in the same manner as the semiconductor layer 140, except that it includes a semiconductor region 221 connected to the outer peripheral surface of the N-type well NW' and the semiconductor layer 120, and a semiconductor region 222 provided above the semiconductor region 221.

The semiconductor region 221 functions as an I-type semiconductor. The concentration of the N-type impurities in the semiconductor region 221 is at least smaller than the concentration of the N-type impurities in the N-type well NW'. Further, the concentration of P-type impurities in the semiconductor region 221 is at least smaller than the concentration of P-type impurities in the semiconductor region 222.

The semiconductor region 222 contains the P-type impurities such as boron (B) and functions as a P-type semiconductor. The semiconductor region 222 is connected to the contact region 141.

According to the semiconductor memory device of the present embodiment, the same effects as those of the semiconductor memory device of the first embodiment can be obtained.

In the semiconductor memory device according to the present embodiment, the semiconductor region 221 is connected to the N-type well NW'. Accordingly, it is possible to further reduce the resistance value between the semiconductor layer 120 and the conductive layer 150 in the read operation.

The semiconductor memory device according to the present embodiment may be manufactured by substantially the same method as the semiconductor memory device according to the first embodiment. However, when manufacturing the semiconductor memory device according to the present embodiment, the steps described with reference to FIG. 8 are performed under the condition that the semiconductor layer 140B contains the P-type impurities. Further, the step described with reference to FIG. 20 is performed under the condition that silicon formed in the steps does not contain impurities.

Fifth Embodiment

Configuration

Figure 26:
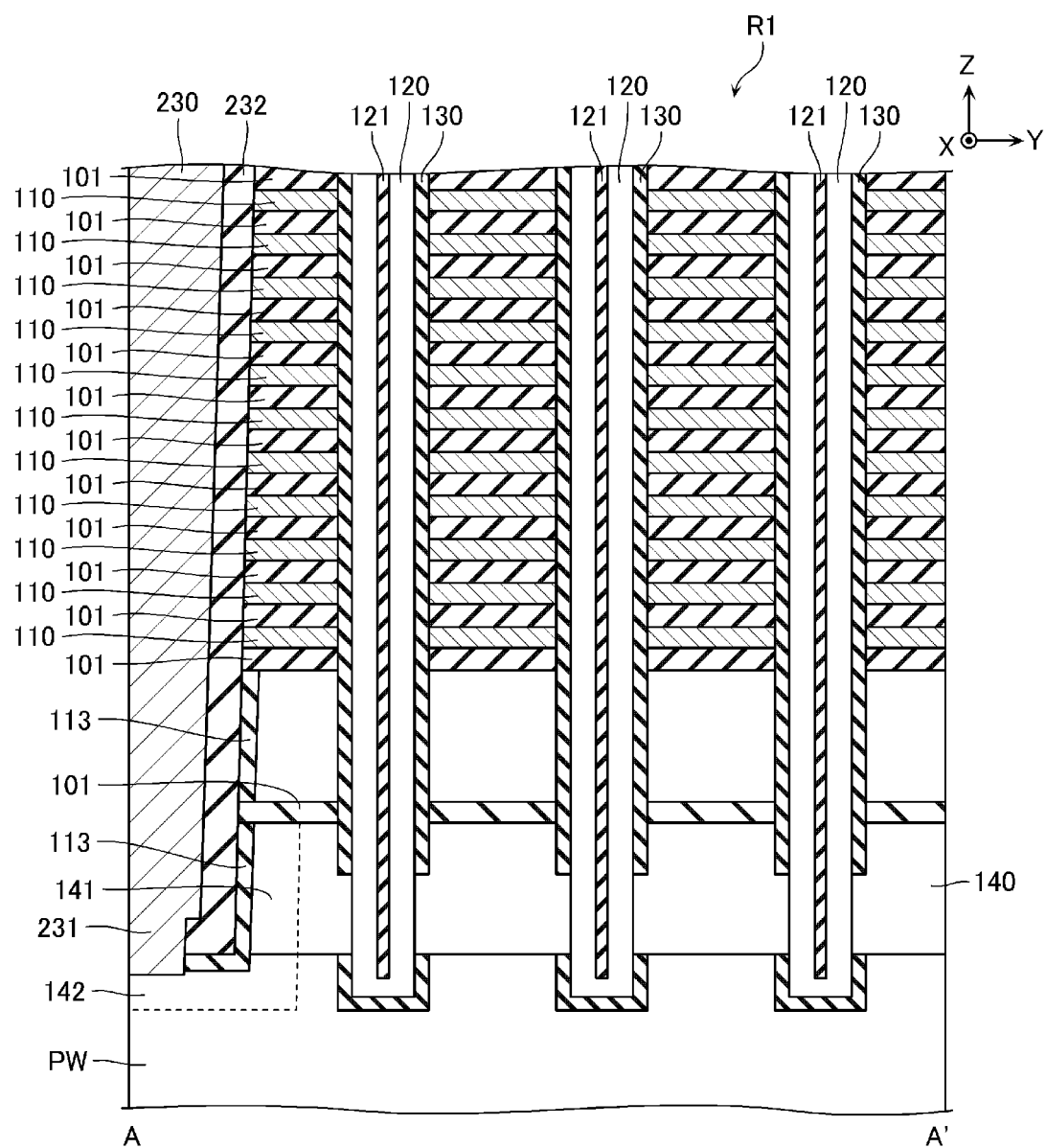
FIG. 26 illustrates a schematic cross-sectional view of a semiconductor memory device according to a fifth embodiment.

Next, a fifth embodiment will be described with reference to FIG. 26. FIG. 26 illustrates a schematic cross-sectional view of the semiconductor memory device according to the fifth embodiment. In the following description, the same parts as those of the first embodiment are denoted by the same reference numerals, and the description thereof is omitted.

The semiconductor memory device according to the fifth embodiment is basically configured in the same manner as the semiconductor memory device according to the first embodiment. However, the semiconductor memory device according to the fifth embodiment includes a conductive layer 230 instead of the conductive layer 150 (FIGS. 2 and 6).

As illustrated in FIG. 26, in the present embodiment, a part of the side surface and the bottom surface of the conductive layer 230 is covered with an insulating layer 232. The lower end portion 231 of the conductive layer 230 is connected to the contact region 141 of the semiconductor layer 140 through the contact region 142 of the P-type well PW. In the illustrated example, the upper end of the contact region 141 reaches the upper surface of the semiconductor layer 140.

The semiconductor memory device according to the fifth embodiment is basically configured in the same manner as the first embodiment. However, it is also possible to adopt such a configuration in the second to fourth embodiments.

Manufacturing Method

Next, with reference to FIGS. 27 to 32, a manufacturing method of the semiconductor memory device according to the present embodiment will be described.

In the manufacturing method, for example, the steps described with reference to FIGS. 8 to 11 are performed.

Figure 27:
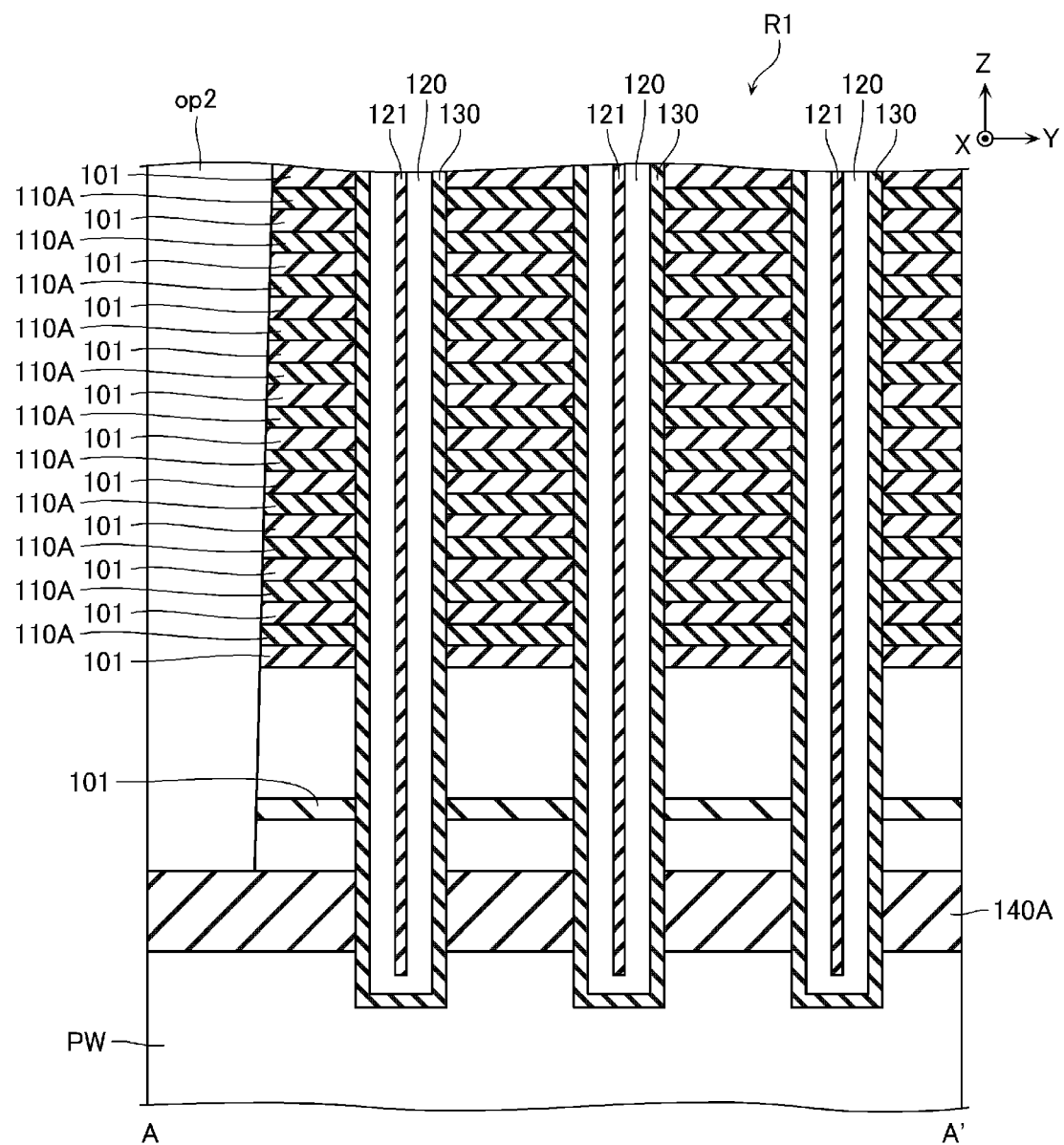
FIGS. 27-32 are schematic cross-sectional views of a structure to illustrate a method of manufacturing the semiconductor memory device according to the fifth embodiment.

Next, as illustrated in FIG. 27, a part of the semiconductor layer 140B is removed to expose the upper surface of the sacrificial layer 140A. This step is performed, for example, in the same manner as the step described with reference to FIG. 17.

Figure 28:
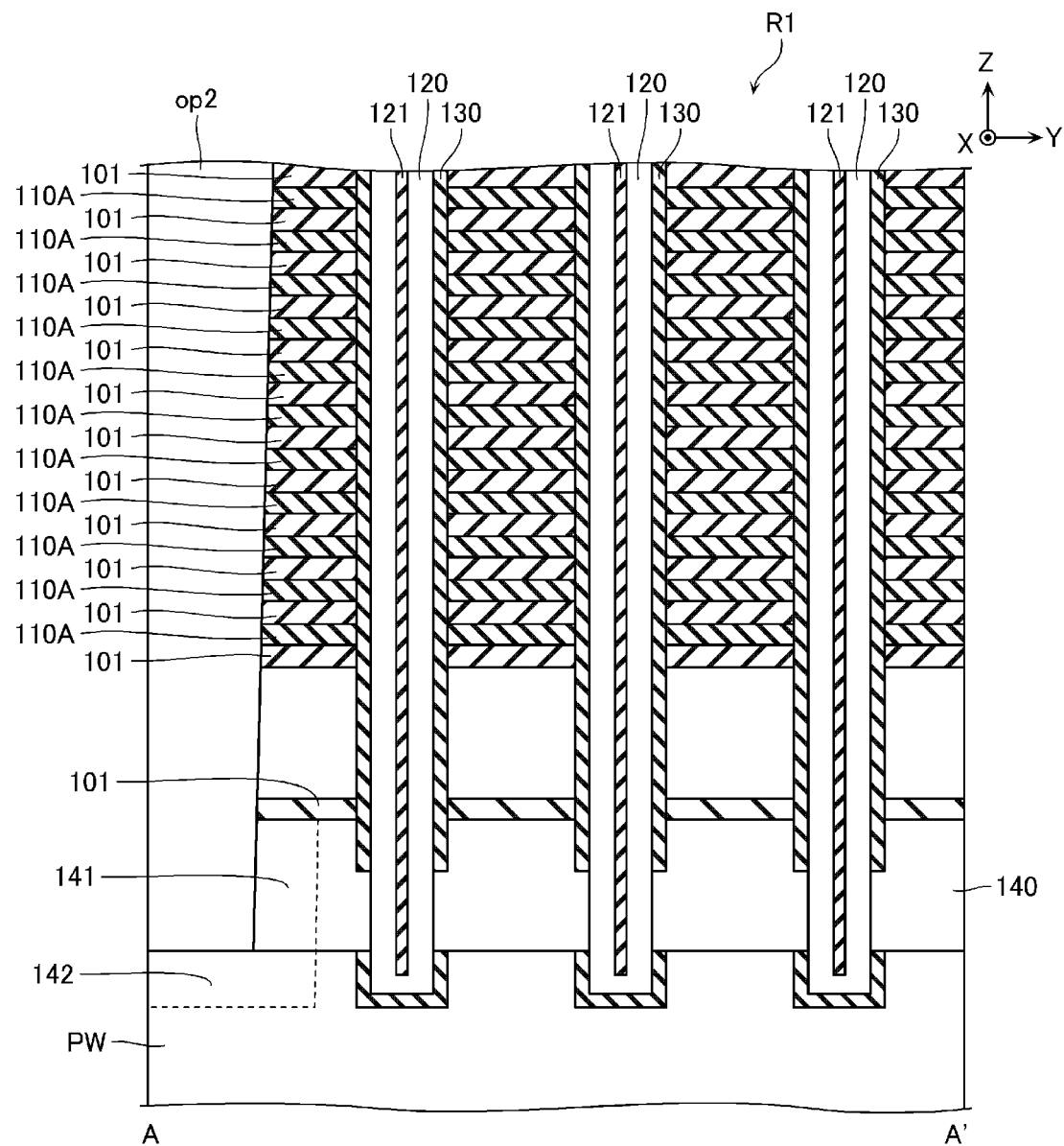

Next, as illustrated in FIG. 28, the semiconductor layer 140 is formed. This step is performed, for example, in the same manner as the steps described with reference to FIGS. 18 to 22.

Figure 29:
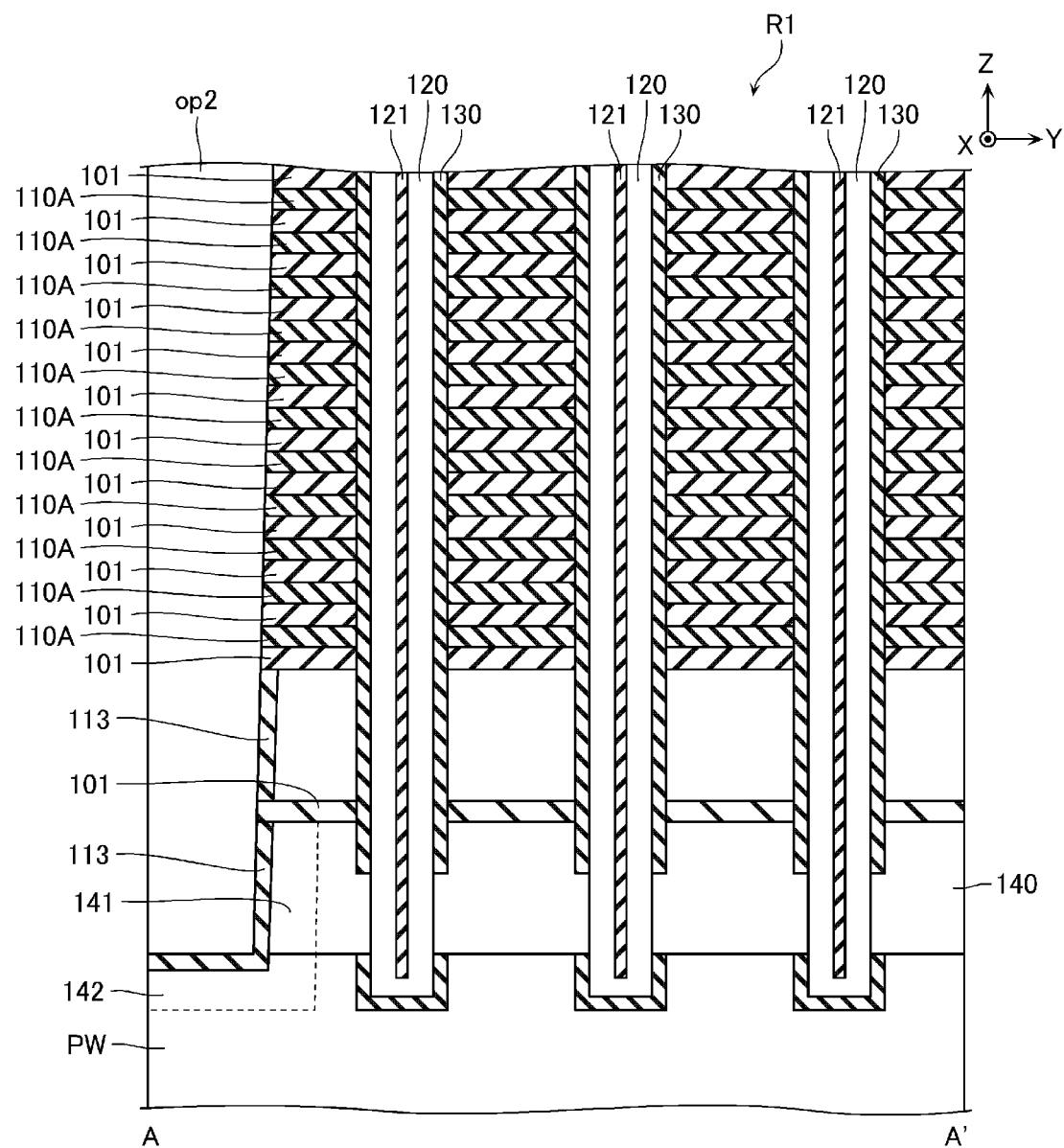

Next, as illustrated in FIG. 29, the oxide layer 113 is formed on the side surfaces of the conductive layer 112 and the semiconductor layer 140 in the Y-direction. This step is performed, for example, under the condition that silicon nitride is not oxidized and polycrystalline silicon is selectively oxidized.

Figure 30:
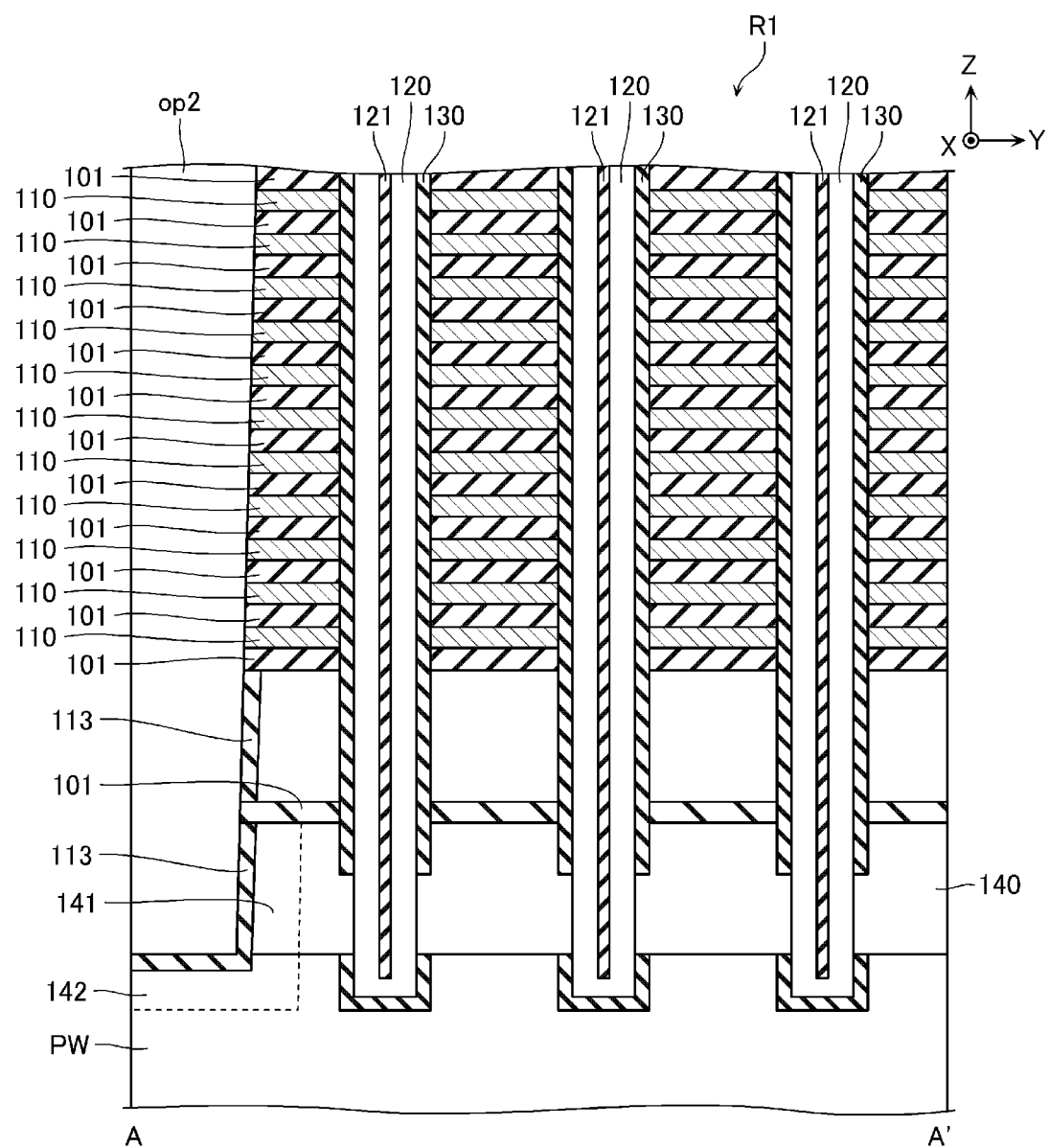

Next, as illustrated in FIG. 30, the sacrificial layer 110A is removed to form the conductive layer 110. This process is performed, for example, in the same manner as the process described with reference to FIGS. 13 to 15.

Figure 31:
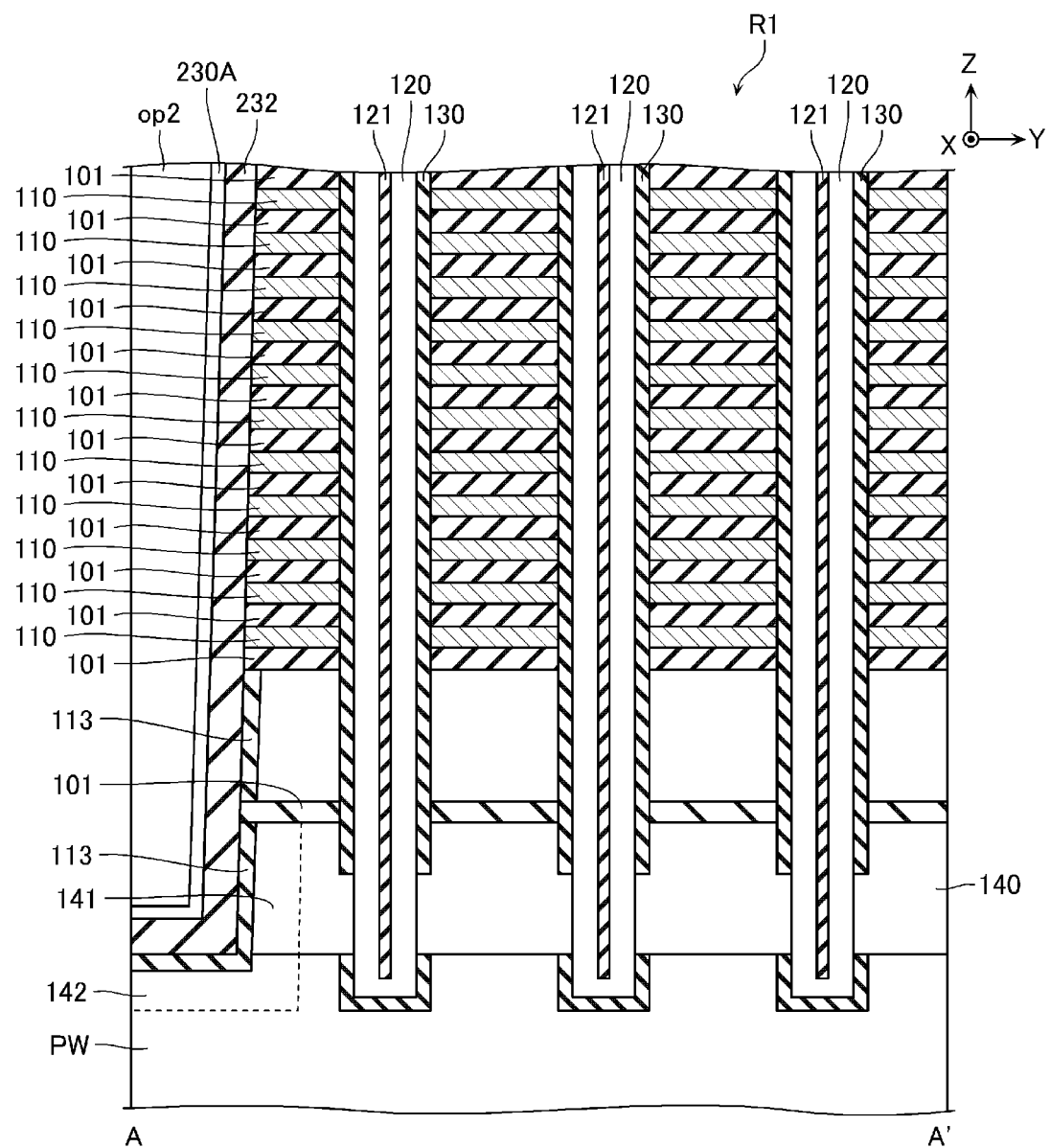

Next, as illustrated in FIG. 31, an insulating layer 232 and a semiconductor layer 230A are formed on the side surface and the bottom surface of the opening op2. This step is performed, for example, by a method such as CVD.

Figure 32:
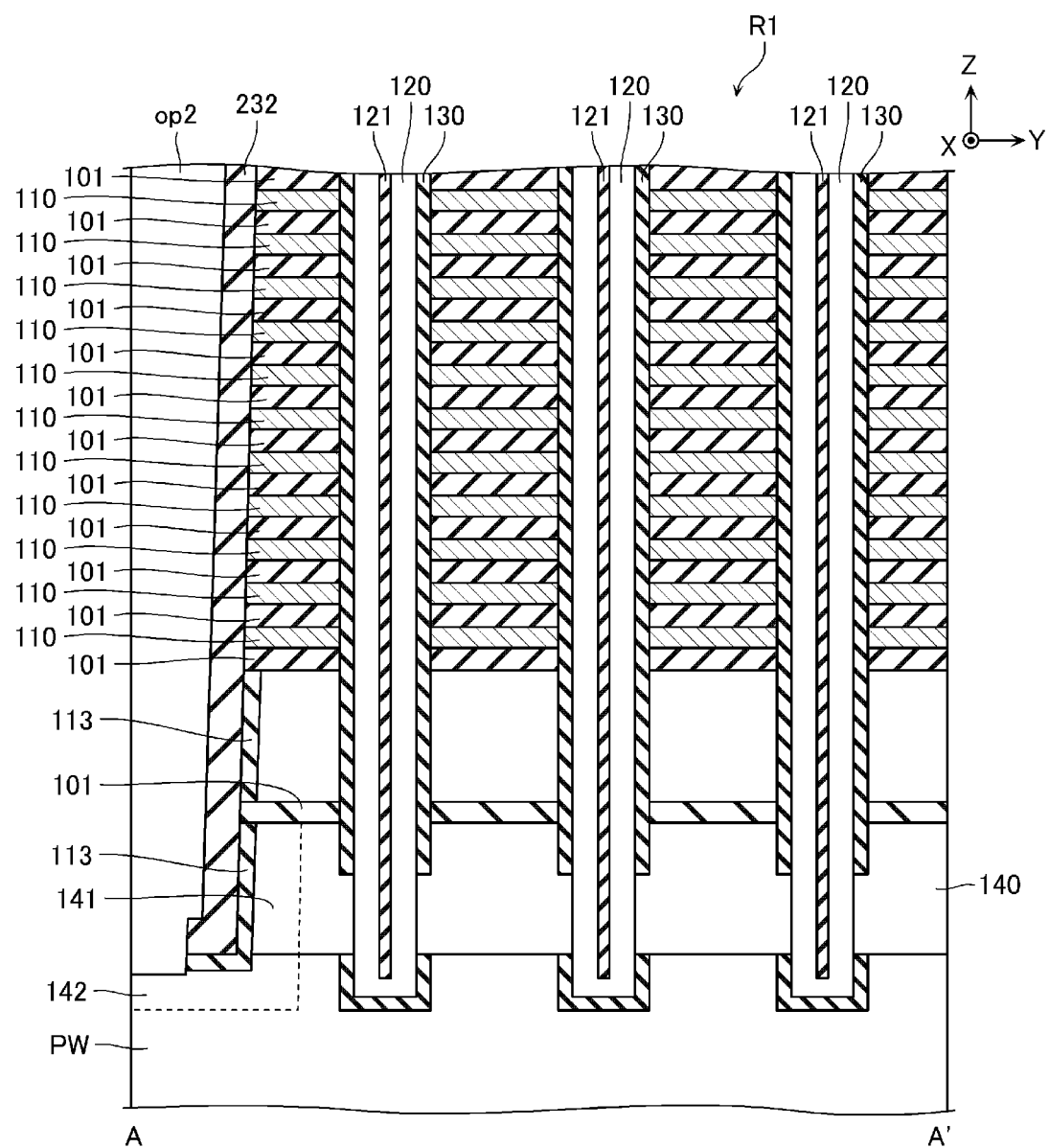

Next, as illustrated in FIG. 32, a portion of the insulating layer 232 and the semiconductor layer 230A formed on the bottom surface of the opening op2 is removed to expose the upper surface of the P-type well PW. This step is performed, for example, by a method such as RIE.

Thereafter, a conductive layer 230 is formed inside the opening op2 by a method such as CVD to form the structure illustrated in FIG. 26.

Sixth Embodiment

Configuration

Figure 33:
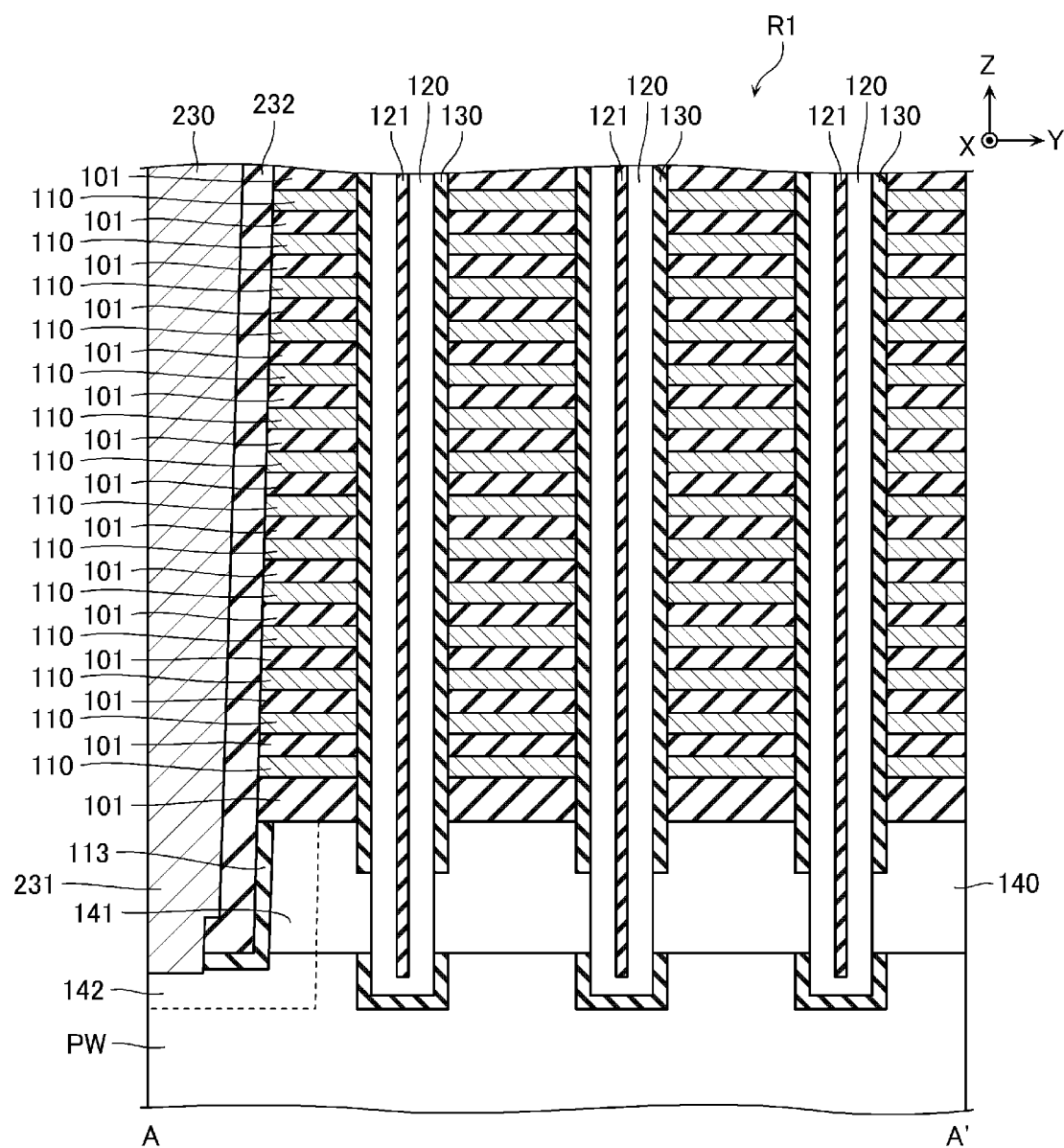
FIG. 33 illustrates a schematic cross-sectional view of a semiconductor memory device according to a sixth embodiment.

Next, a sixth embodiment will be described with reference to FIG. 33. FIG. 33 illustrates a schematic cross-sectional view of the semiconductor memory device according to the sixth embodiment. In the following description, the same parts as those of the first embodiment are denoted by the same reference numerals, and the description thereof is omitted.

The semiconductor memory device according to the sixth embodiment is basically configured in the same manner as the semiconductor memory device according to the first embodiment. However, the semiconductor memory device according to the sixth embodiment does not include the conductive layer 112.

The semiconductor memory device according to the sixth embodiment is basically configured in the same manner as the first embodiment. However, it is also possible to adopt such a configuration in the second to fourth embodiments.

Manufacturing Method

Next, with reference to FIGS. 34 to 40, a method of manufacturing the semiconductor memory device according to the present embodiment will be described.

In the manufacturing method, for example, the steps described with reference to FIGS. 8 to 12 are performed. However, in the steps described with reference to FIG. 8, a sacrificial layer 233 such as silicon oxide, a sacrificial layer 234 such as silicon, and a sacrificial layer 235 such as silicon oxide are formed instead of the sacrificial layer 140A such as silicon nitride. The conductive layer 112 is not formed.

Figure 34:
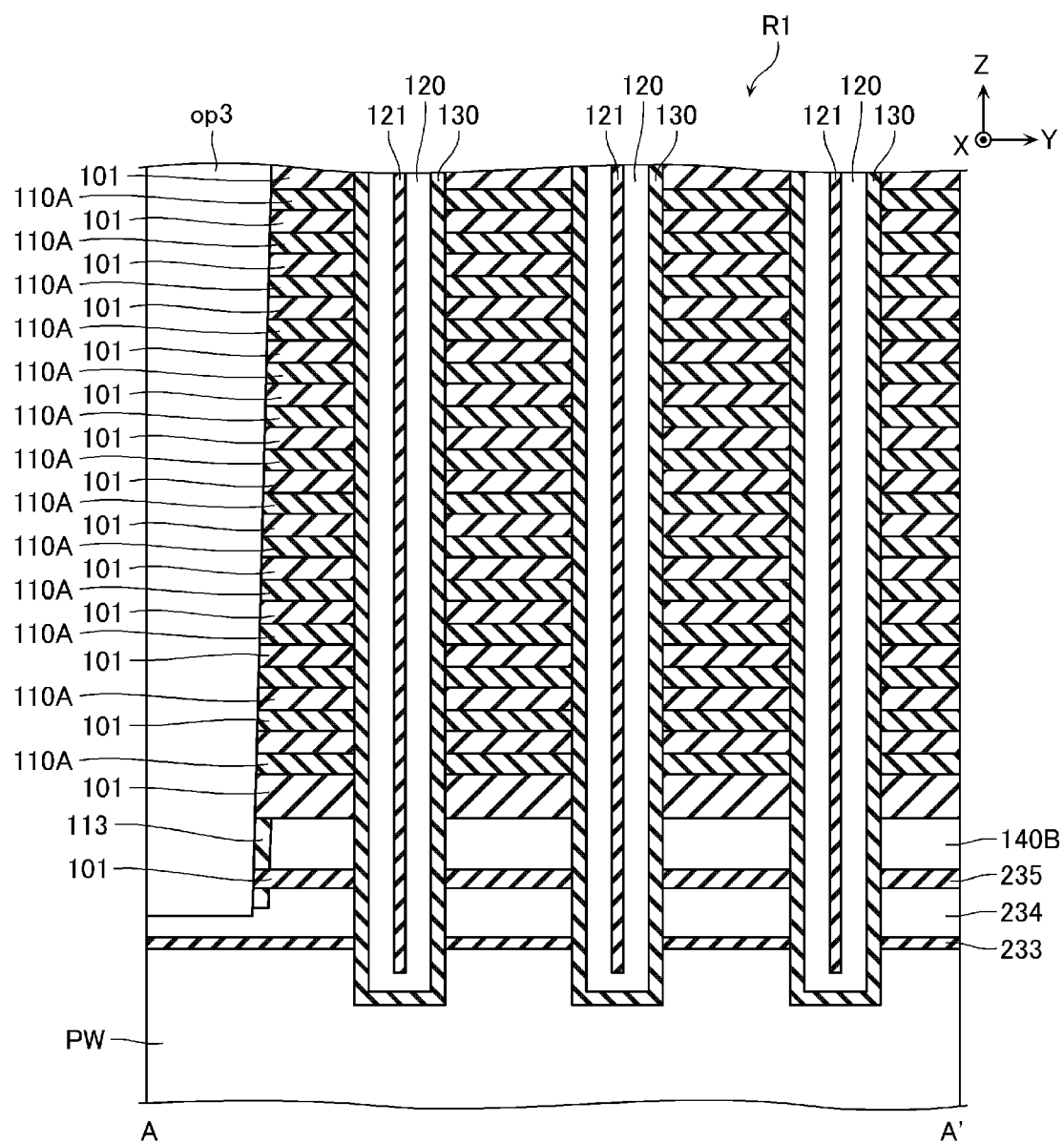
FIGS. 34-40 are schematic cross-sectional views of a structure to illustrate a method of manufacturing the semiconductor memory device according to the sixth embodiment.

Next, as illustrated in FIG. 34, a part of the oxide layer 113 is removed to expose the upper surface of the sacrificial layer 234. This step is performed, for example, in the same manner as the step described with reference to FIG. 17.

Figure 35:
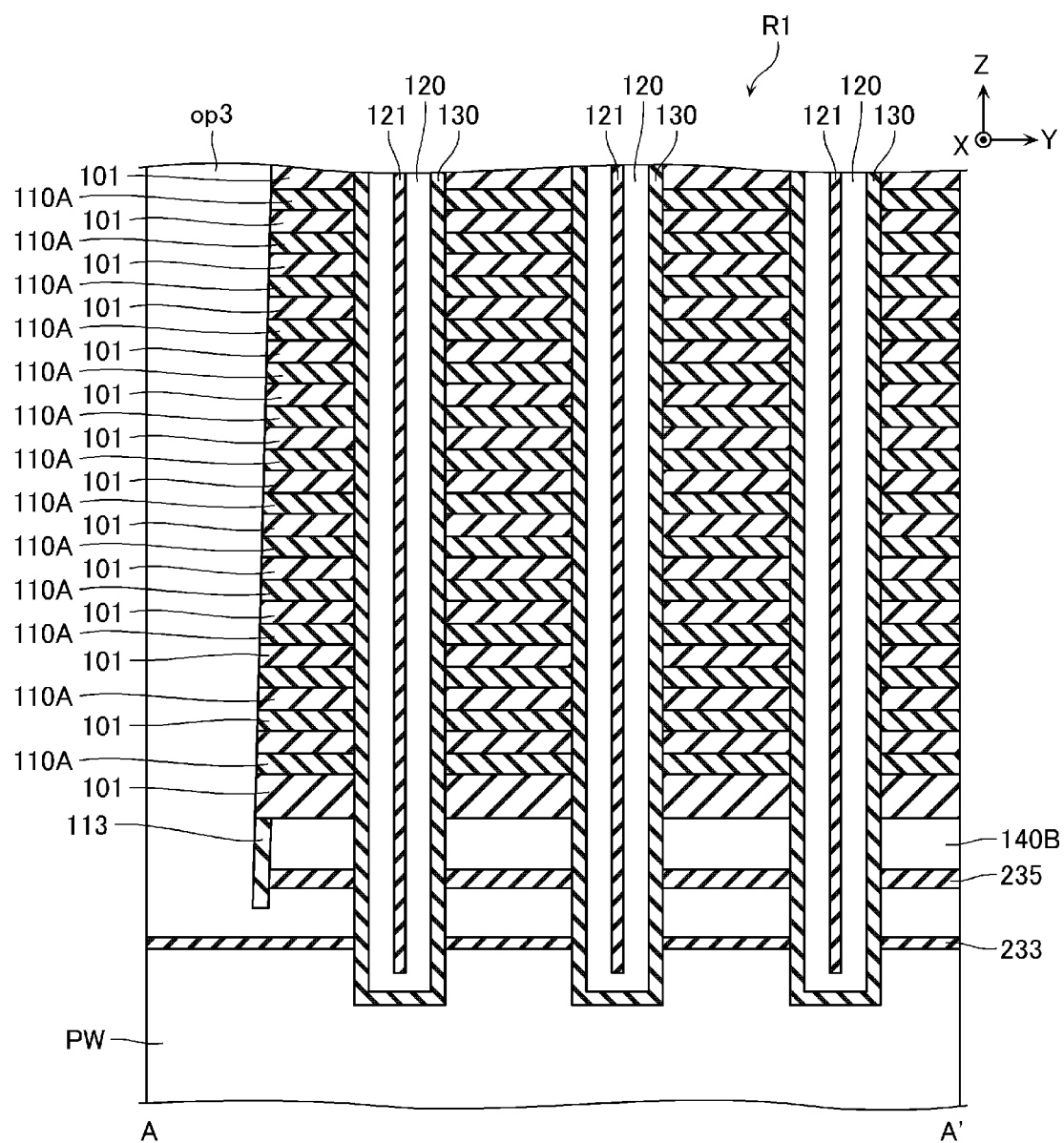

Next, as illustrated in FIG. 35, the sacrificial layer 234 is removed to expose the upper surface of the sacrificial layer 233, the lower surface of the sacrificial layer 235, and the outer peripheral surface of the gate insulating film 130. This step is performed, for example, in the same manner as the step described with reference to FIG. 18.

Figure 36:
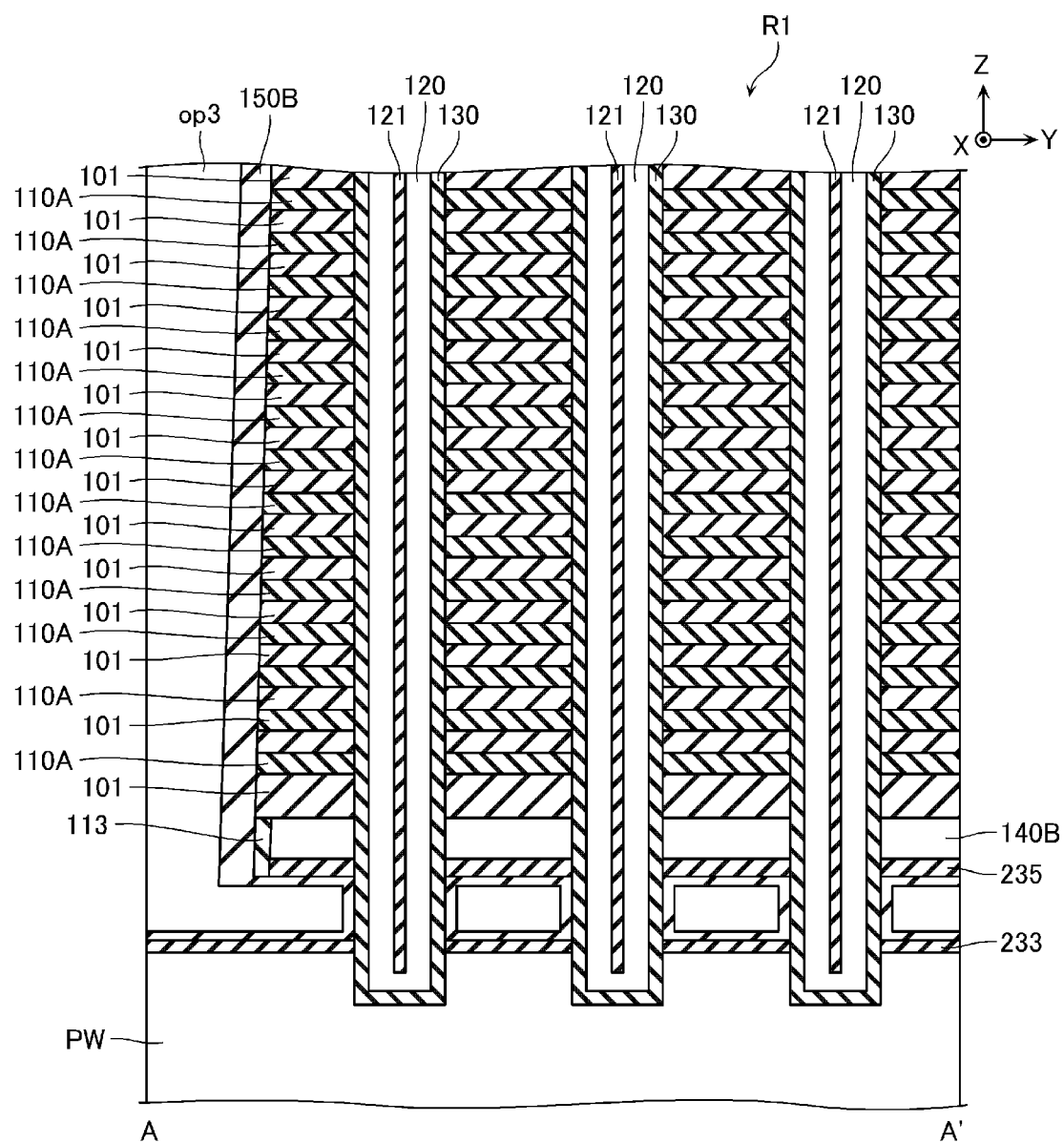

Next, as illustrated in FIG. 36, a protective film 150B such as silicon oxide is formed on the upper surface of the sacrificial layer 233, the lower surface of the sacrificial layer 235, the outer peripheral surface of the gate insulating film 130, and the side surface of the opening op2. This step is performed by, for example, the CVD. This step is performed under the condition that the thickness of a portion formed on the side surface of the opening op2 in the protective film 150B in the Y-direction is larger than the thickness of the other portions.

Figure 37:
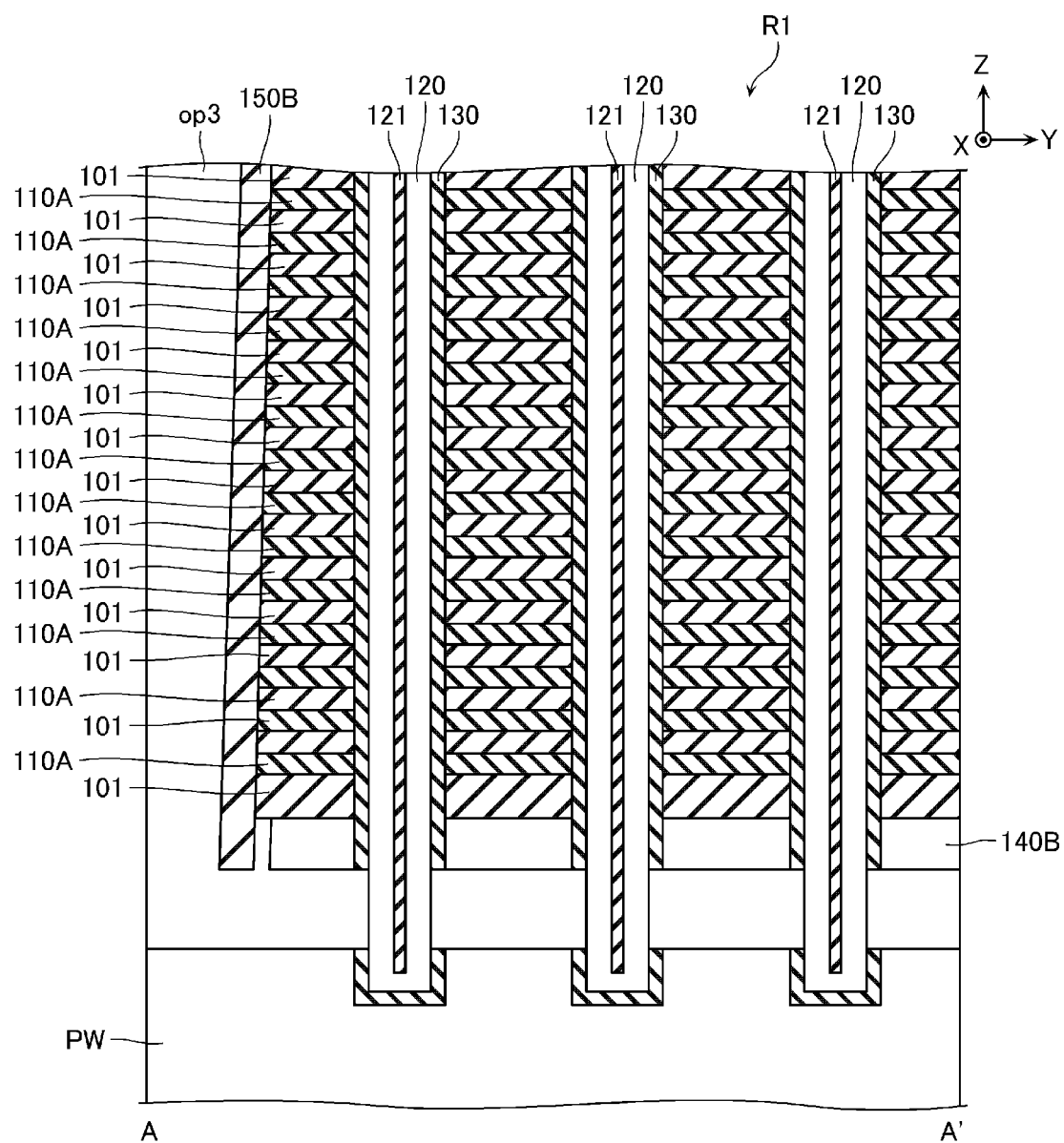

Next, as illustrated in FIG. 37, a part of the protective film 150B, a part of the gate insulating film 130, the sacrificial layer 233, and the sacrificial layer 235 are removed to expose the upper surface of the P-type well PW, the lower surface of the semiconductor layer 140B, and a part of the outer peripheral surface of the semiconductor layer 120. This step is performed, for example, by wet etching or the like.

Figure 38:
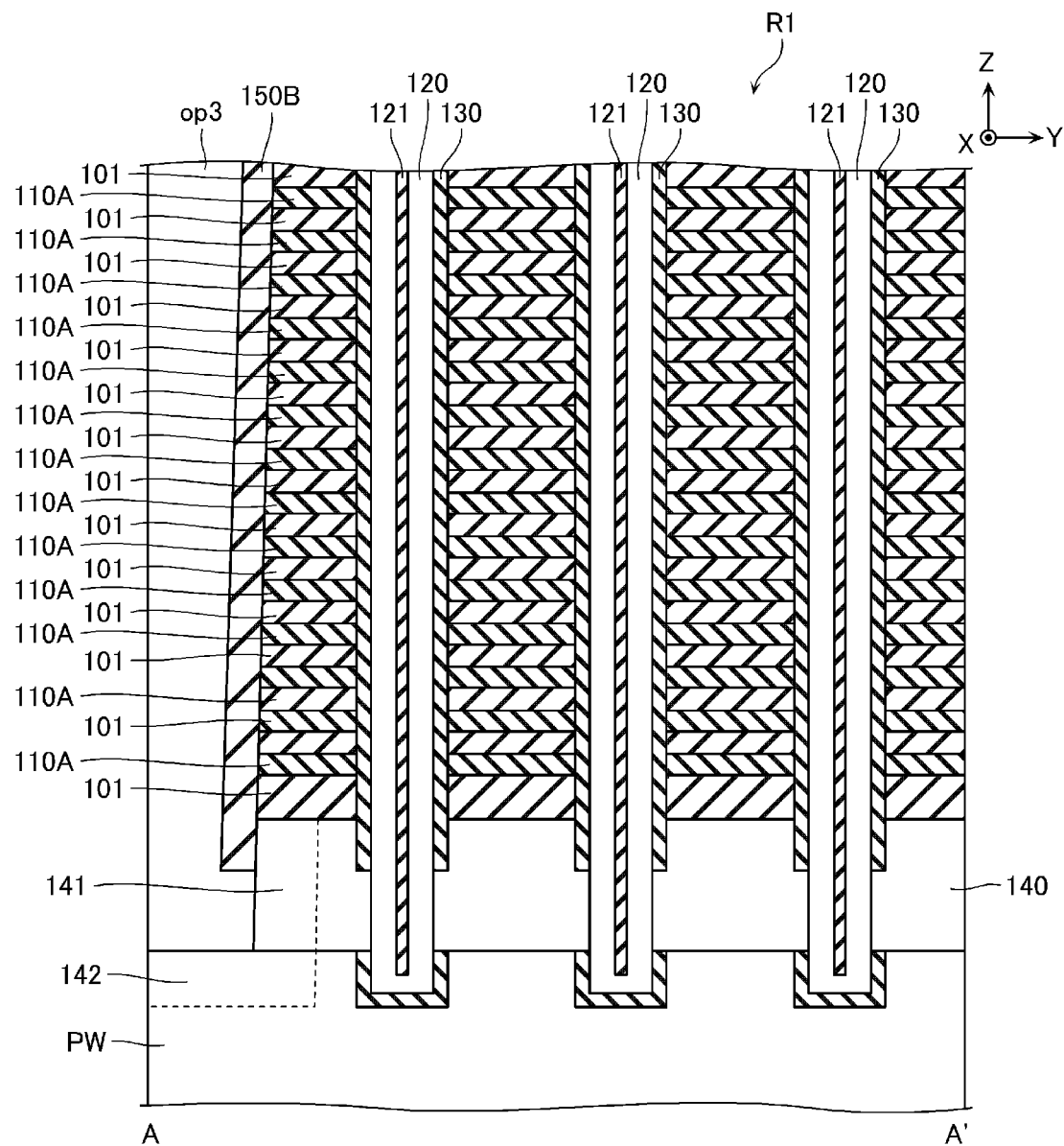

Next, as illustrated in FIG. 38, the semiconductor layer 140 is formed on the upper surface of the P-type well PW, the lower surface of the semiconductor layer 140B, and a part of the outer peripheral surface of the semiconductor layer 120. This step is performed, for example, in the same manner as the steps described with reference to FIGS. 20 to 22.

Figure 39:
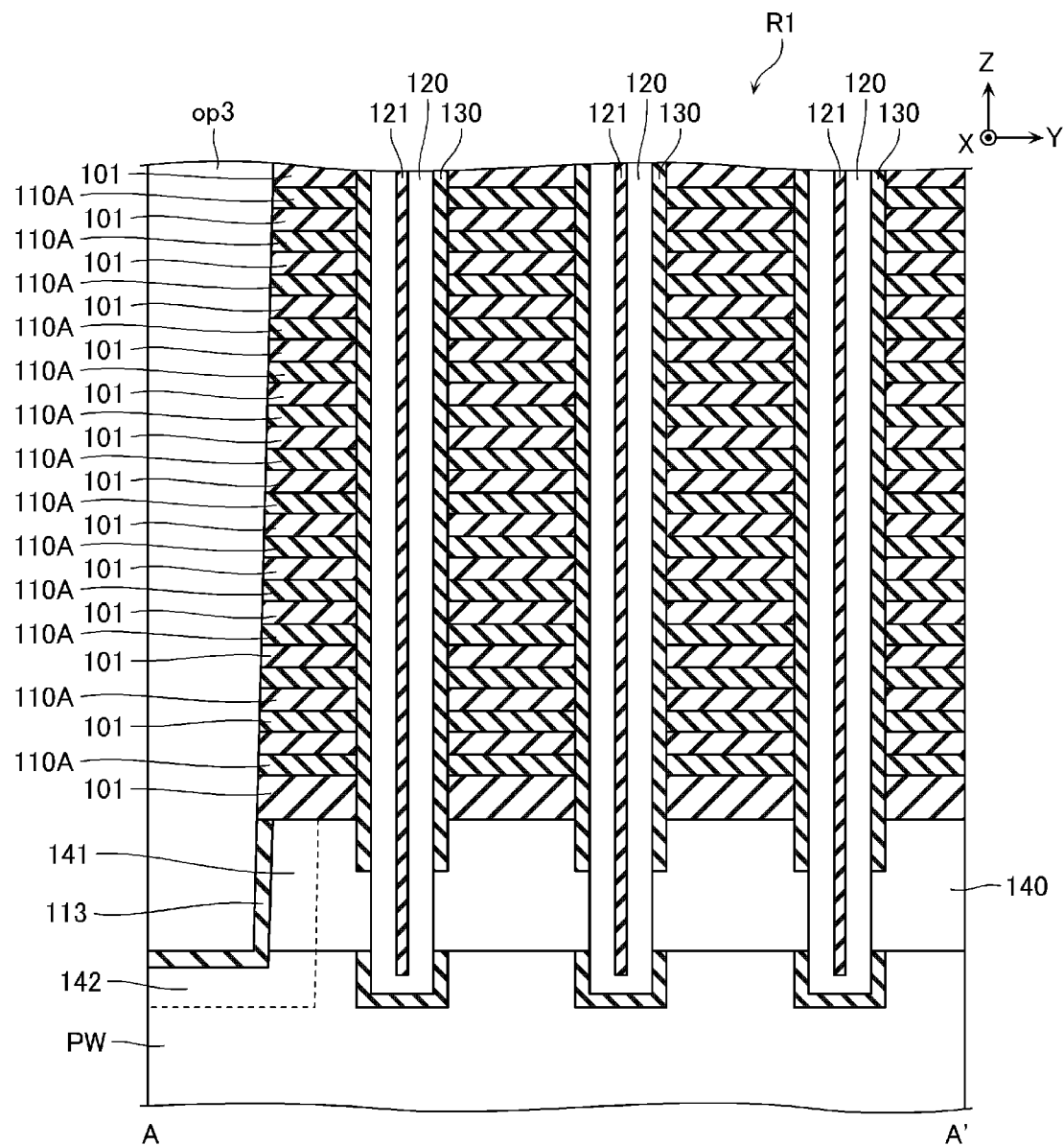

Next, as illustrated in FIG. 39, the protective film 150B is removed, and the oxide layer 113 is formed on the upper surface of the P-type well PW and the side surface of the semiconductor layer 140. This step is performed, for example, under the condition that silicon nitride is not oxidized and polycrystalline silicon is selectively oxidized.

Figure 40:
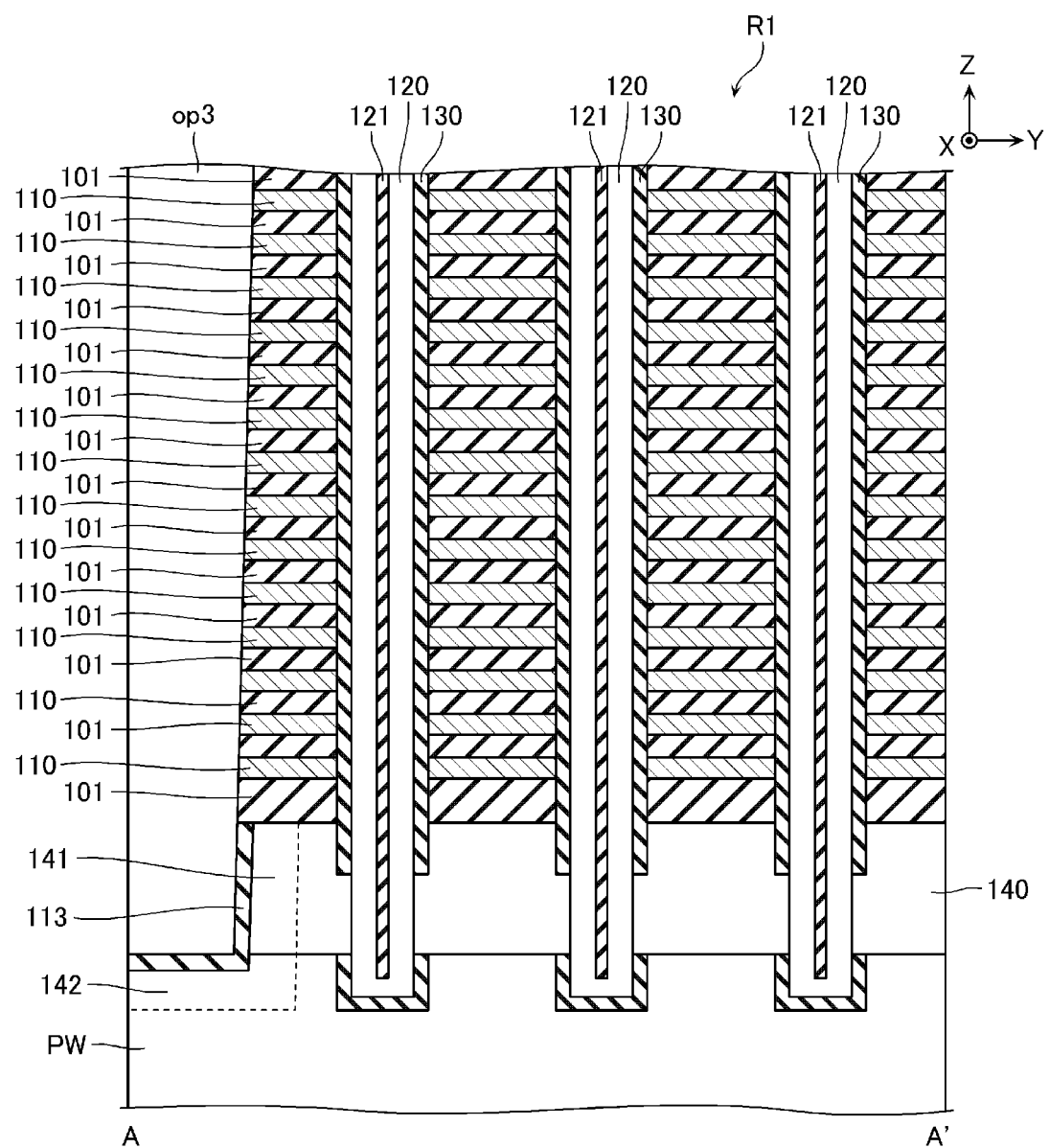

Next, as illustrated in FIG. 40, the sacrificial layers 110A are removed to form the conductive layers 110. This step is performed, for example, in the same manner as the steps described with reference to FIGS. 12 to 14.

Thereafter, a step similar to the steps described with reference to FIGS. 31 and 32 is performed, and the source contact LI is formed inside the opening opt by a method such as CVD to thereby form the structure illustrated in FIG. 33.

Seventh Embodiment

Figure 41:
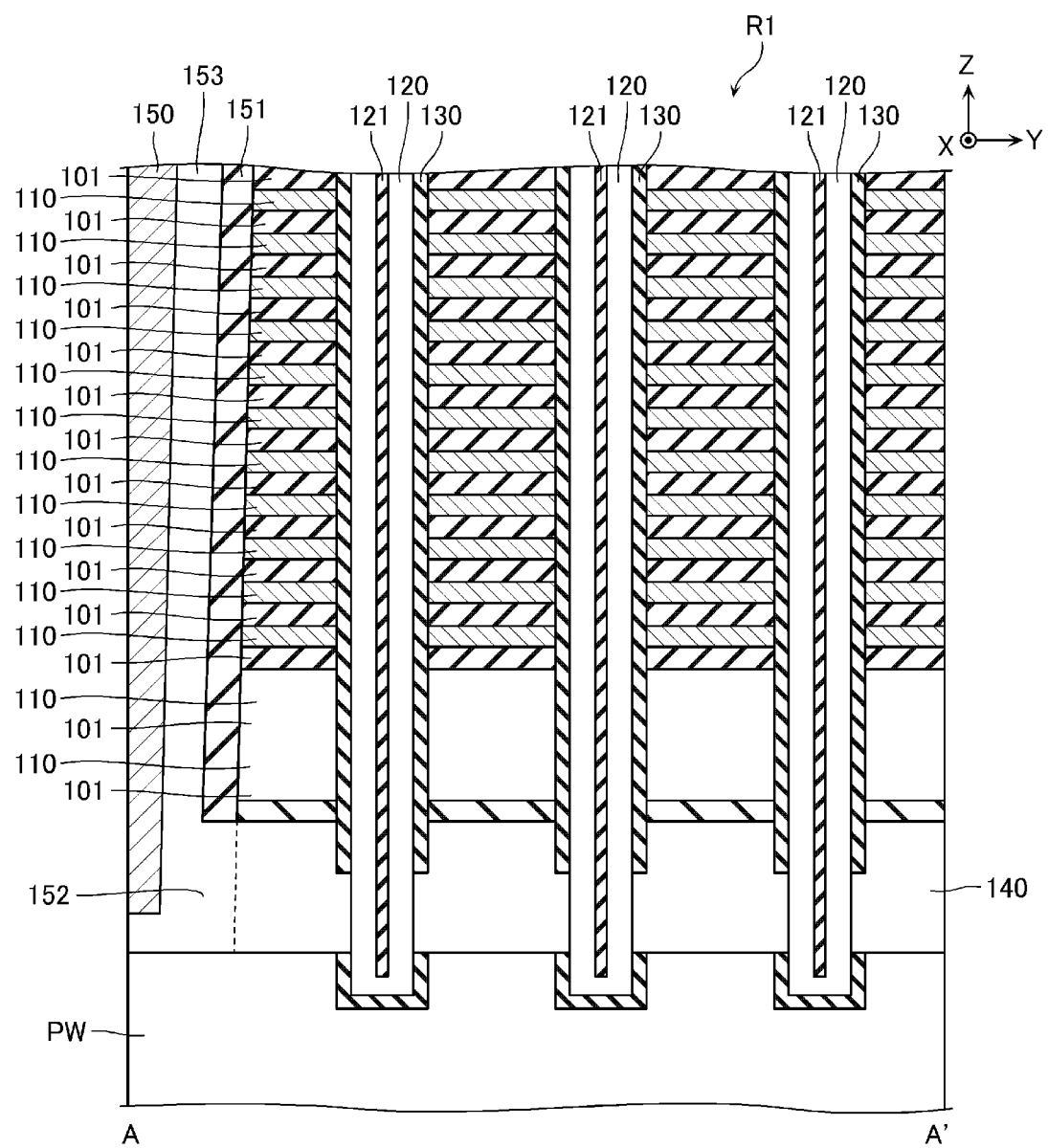
FIG. 41 illustrates a schematic cross-sectional view of a semiconductor memory device according to a seventh embodiment.

Next, a seventh embodiment will be described with reference to FIG. 41. FIG. 41 illustrates a schematic cross-sectional view of a semiconductor memory device according to the seventh embodiment. In the following description, the same parts as those of the first embodiment are denoted by the same reference numerals, and the description thereof is omitted.

The semiconductor memory device according to the seventh embodiment is basically configured in the same manner as the semiconductor memory device according to the first embodiment. However, in the seventh embodiment, a semiconductor layer 153 is provided between the conductive layer 150 and the insulating layer 151. The semiconductor layer 153 contains polycrystalline silicon (Si) or the like containing N-type impurities such as phosphorus (P). The semiconductor layer 153 is connected to the conductive layer 150, the semiconductor layer 140, and the P-type well PW. The lower end portion of the semiconductor layer 153 functions as a contact region of the semiconductor layer 140.

The semiconductor memory device according to the seventh embodiment is basically configured in the same manner as the first embodiment. However, it is also possible to adopt such a configuration in the second to fourth embodiments.

The semiconductor memory device according to the present embodiment may be manufactured by substantially the same method as the semiconductor memory device according to the first embodiment. However, when manufacturing the semiconductor memory device according to the present embodiment, the step described with reference to FIG. 21 is not performed.

Eighth Embodiment

Figure 42:
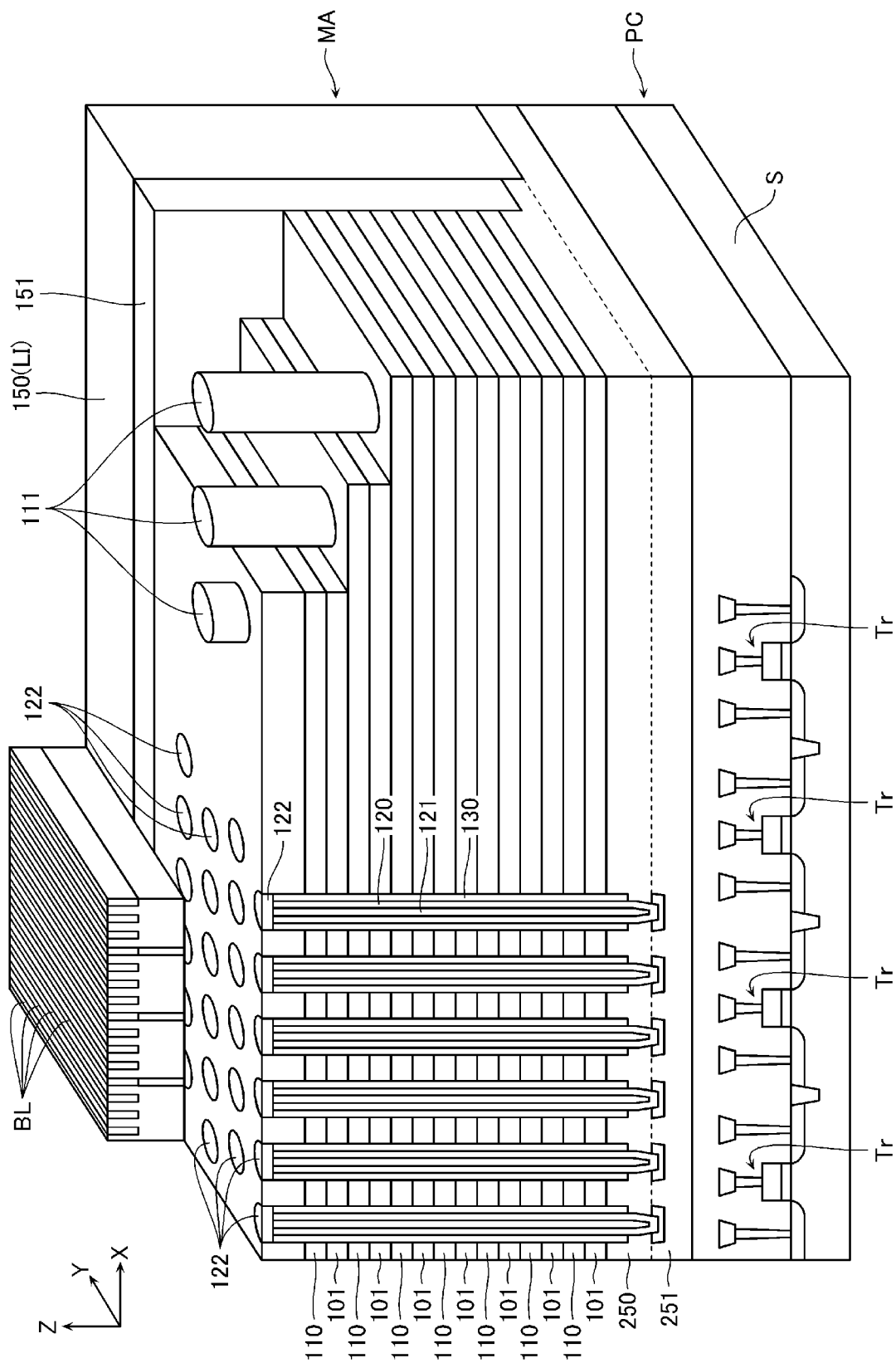
FIG. 42 illustrates a schematic cross-sectional view of a semiconductor memory device according to an eighth embodiment.

Next, an eighth embodiment will be described with reference to FIG. 42. FIG. 42 illustrates a schematic perspective view of the semiconductor memory device according to the eighth embodiment. In the following description, the same parts as those of the first embodiment are denoted by the same reference numerals, and the description thereof is omitted.

The semiconductor memory device according to the eighth embodiment is basically configured in the same manner as the semiconductor memory device according to the first embodiment. However, in the eighth embodiment, a plurality of transistors Tr of the peripheral circuit PC are provided between the substrate S and the memory cell array MA. The semiconductor memory device according to the eighth embodiment includes a semiconductor layer 250 instead of the semiconductor layer 140 (FIGS. 2 and 6).

The semiconductor layer 250 is basically configured in the same manner as the semiconductor layer 140, except that it includes a semiconductor region 251 containing the same impurities as the P-type well PW at the same concentration as the P-type well PW, in addition to the semiconductor region in the semiconductor layer 140.

The semiconductor memory device according to the eighth embodiment is basically configured in the same manner as in the first embodiment. However, it is also possible to adopt such a configuration in the second to fourth embodiments. For example, when adopting such a configuration in the fourth embodiment, the semiconductor region 251 may contain the same impurities as the N-type well NW' (FIG. 25) at the same concentration as the N-type well NW'.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate;
    a plurality of gate electrodes arranged in a thickness direction of the substrate;
    a first semiconductor layer extending in the thickness direction and facing the plurality of gate electrodes;
    a gate insulating film between the plurality of gate electrodes and the first semiconductor layer;
    a second semiconductor layer between the substrate and the plurality of gate electrodes and connected to a side surface of the first semiconductor layer in a surface direction along a surface of the substrate; and
    a first contact extending in the thickness direction and electrically connected to the second semiconductor layer, wherein
    the gate insulating film includes a first end portion extending into the second semiconductor layer in the thickness direction, a side surface of the first end portion in the surface direction facing the second semiconductor layer, and
    the second semiconductor layer includes a first region in contact with the side surface of the first semiconductor layer in the surface direction and containing P-type impurities, and a first contact region electrically connected to the first contact and having a higher concentration of N-type impurities than the first region.

2. The semiconductor memory device according to claim 1, wherein
    the substrate includes a P-type well, and
    the second semiconductor layer is in contact with the P-type well.

3. The semiconductor memory device according to claim 1, wherein the first contact region of the second semiconductor layer is in contact with a side surface of the first contact.

4. The semiconductor memory device according to claim 1, wherein the substrate further includes a P-type well and a N-type impurity region in the P-type well, the N-type impurity region of the substrate being in contact with a bottom surface of the first contact and a bottom surface of the first contact region of the second semiconductor layer.

5. The semiconductor memory device according to claim 1, wherein the second semiconductor layer further includes a second region between the first region and the plurality of gate electrodes in the thickness direction, the second region having a higher concentration of N-type impurities than the first region.

6. The semiconductor memory device according to claim 1, wherein the second semiconductor layer further includes a second region between the first region and the plurality of gate electrodes in the thickness direction, the second region having a lower concentration of P-type impurities than the first region.

7. The semiconductor memory device according to claim 1, wherein
    the substrate further includes a P-type well and a N-type impurity region in the P-type well, and
    the first contact region of the second semiconductor layer is electrically connected to the first contact through the N-type impurity region of the substrate, and not in direct contact with the first contact.

8. The semiconductor memory device according to claim 1, wherein the first contact is a metal contact.

9. The semiconductor memory device according to claim 1, wherein the first contact includes a metal portion surrounded by a semiconductor portion.

10. The semiconductor memory device according to claim 1, further comprising:
    a second contact extending in the thickness direction and electrically connected to the second semiconductor layer, the first and second contacts being arranged in the surface direction, wherein
    the second semiconductor layer further includes a second contact region electrically connected to the second contact and having a higher concentration of N-type impurities than the first region.

11. The semiconductor memory device according to claim 10, wherein the plurality of gate electrodes, the first semiconductor layer, the gate insulating film, and the second semiconductor layer are provided in a region between the first contact and the second contact.

12. A semiconductor memory device comprising:
   a substrate;
   a plurality of gate electrodes arranged in a thickness direction of the substrate;
   a first semiconductor layer extending in the thickness direction and facing the plurality of gate electrodes;
   a gate insulating film between the plurality of gate electrodes and the first semiconductor layer;
   a second semiconductor layer between the substrate and the plurality of gate electrodes and connected to a side surface of the first semiconductor layer in a surface direction along a surface of the substrate; and
   a first contact extending in the thickness direction and electrically connected to the second semiconductor layer, wherein
   the gate insulating film includes a first end portion extending into the second semiconductor layer in the thickness direction, a side surface of the first end portion in the surface direction facing the second semiconductor layer, and
   the second semiconductor layer includes a first region in contact with the side surface of the first semiconductor layer in the surface direction, a second region between the first region and the plurality of gate electrodes in the thickness direction and having a higher concentration of P-type impurities than the first region, and a first contact region electrically connected to the first contact and having a higher concentration of N-type impurities than the first region.

13. The semiconductor memory device according to claim 12, wherein
   the substrate includes an N-type well, and
   the second semiconductor layer is in contact with the N-type well.

14. The semiconductor memory device according to claim 12, wherein the first contact region of the second semiconductor layer is in contact with a side surface of the first contact.

15. The semiconductor memory device according to claim 12, wherein the substrate further includes an N-type well and a N-type impurity region in the N-type well, the N-type impurity region of the substrate being in contact with a bottom surface of the first contact and a bottom surface of the first contact region of the second semiconductor layer.

16. The semiconductor memory device according to claim 15, wherein the first contact region of the second semiconductor layer is electrically connected to the first contact through the N-type impurity region of the substrate, and not in direct contact with the first contact.

17. The semiconductor memory device according to claim 12, wherein the first contact is a metal contact.

18. The semiconductor memory device according to claim 12, wherein the first contact includes a metal portion surrounded by a semiconductor portion.

19. The semiconductor memory device according to claim 12, further comprising:
   a second contact extending in the thickness direction and electrically connected to the second semiconductor layer, the first and second contacts being arranged in the surface direction, wherein
   the second semiconductor layer further includes a second contact region electrically connected to the second contact and having a higher concentration of N-type impurities than the first region.

20. The semiconductor memory device according to claim 19, wherein the plurality of gate electrodes, the first semiconductor layer, the gate insulating film, and the second semiconductor layer are provided in a region between the first contact and the second contact.

* * * * *